(12) United States Patent
Suzuki

(10) Patent No.: US 9,559,094 B2
(45) Date of Patent: Jan. 31, 2017

(54) SEMICONDUCTOR DEVICE AND INTEGRATED CIRCUIT

(71) Applicant: SOCIONEXT INC., Yokohama-shi, Kanagawa (JP)

(72) Inventor: Teruo Suzuki, Mie (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/724,485

(22) Filed: May 28, 2015

(65) Prior Publication Data

US 2015/0364463 A1 Dec. 17, 2015

(30) Foreign Application Priority Data

Jun. 12, 2014 (JP) .................................. 2014-121638

(51) Int. Cl.
*H01L 23/62* (2006.01)
*H01L 27/02* (2006.01)

(52) U.S. Cl.
CPC ......... *H01L 27/027* (2013.01); *H01L 27/0255* (2013.01)

(58) Field of Classification Search
CPC ............. H01L 27/0262; H01L 27/0255; H01L 27/0266; H01L 27/0259; H01L 27/0251; H01L 23/60; H01L 27/0629; H01L 29/0692; H01L 29/8611; H01L 27/0248; H01L 27/088; H01L 29/0619; H01L 29/861; H01L 21/82
USPC .................. 257/355, 173, 360, 356, E21.642
See application file for complete search history.

(56) References Cited

U.S. PATENT DOCUMENTS

| | | | |
|---|---|---|---|
| 6,770,918 B2 | 8/2004 | Russ et al. | |
| 6,891,207 B2 | 5/2005 | Pequignot et al. | |
| 8,207,581 B2 | 6/2012 | Takasu | |
| 2003/0168701 A1* | 9/2003 | Voldman | H01L 27/0255 257/355 |
| 2013/0026550 A1* | 1/2013 | Yoshioka | H01L 29/861 257/296 |

FOREIGN PATENT DOCUMENTS

| | | |
|---|---|---|
| JP | 2003-179150 A | 6/2003 |
| JP | 2004-221569 A | 8/2004 |
| JP | 2009-071173 A | 4/2009 |
| JP | 2011-071327 A | 4/2011 |

* cited by examiner

*Primary Examiner* — Benjamin Sandvik
*Assistant Examiner* — Herve Assouman
(74) *Attorney, Agent, or Firm* — Arent Fox LLP

(57) ABSTRACT

A semiconductor device includes a first semiconductor region that has an external profile including at least one corner, and that includes a semiconductor of a first conductivity type, and a first insulation region that surrounds an outer periphery of the first semiconductor region, and that includes an insulator that, at a corner portion corresponding to the corner, has a depth deeper than a depth at a location other than the corner portion. The semiconductor device further includes a second semiconductor region that surrounds an outer periphery of the first insulation region, and that includes a semiconductor of a second conductivity type, and a second insulation region that surrounds an outer periphery of the second semiconductor region, and that includes an insulator that is deeper than the depth of the first insulation region at the location other than the corner portion.

20 Claims, 20 Drawing Sheets

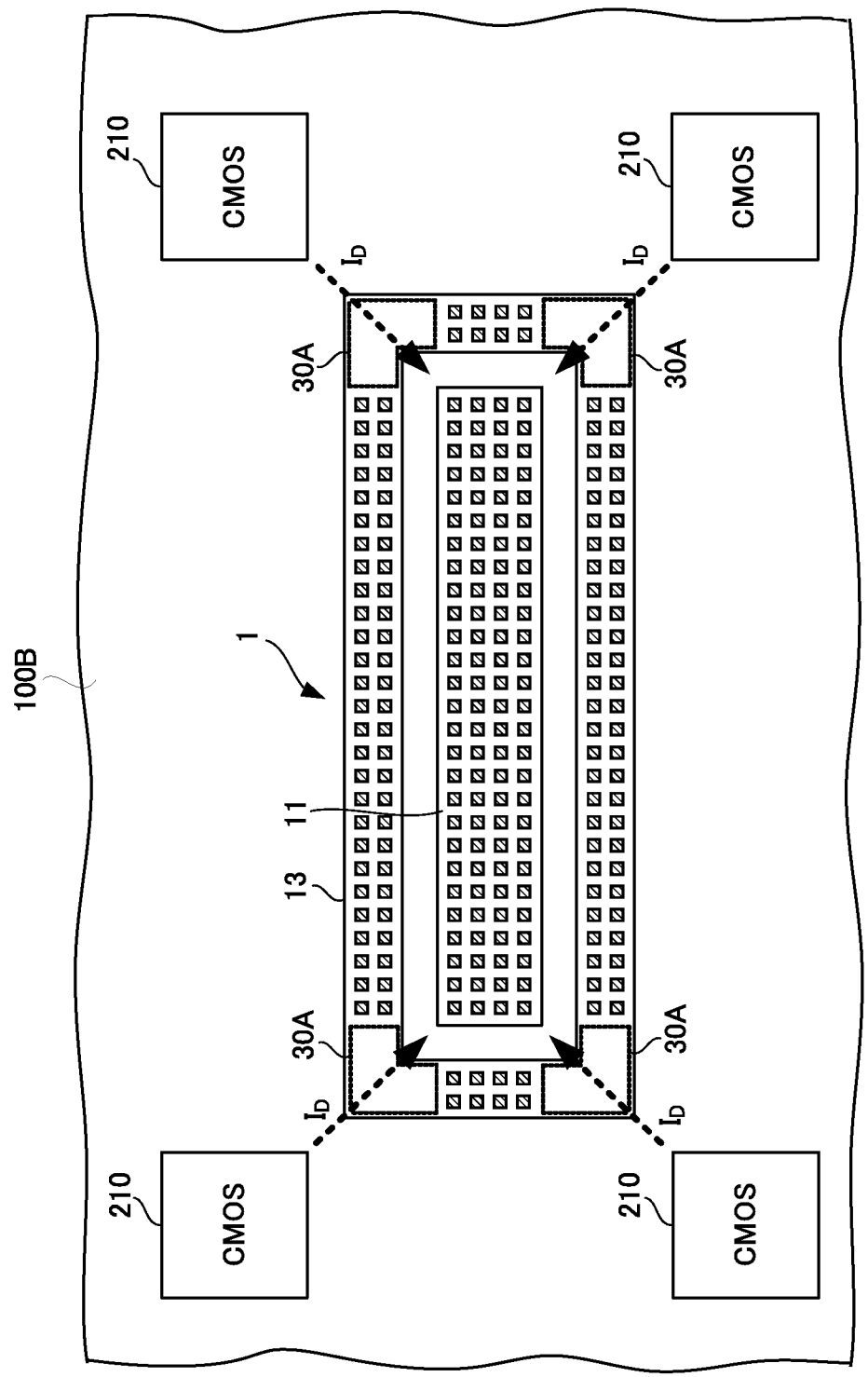

SEMICONDUCTOR DEVICE AND INTEGRATED CIRCUIT

CROSS-REFERENCE TO RELATED APPLICATION

This application is based upon and claims the benefit of priority of the prior Japanese Patent Application, No. 2014-121638, filed on Jun. 12, 2014, the entire contents of which are incorporated herein by reference.

FIELD

The embodiments discussed herein are related to a semiconductor device and an integrated circuit.

BACKGROUND

Semiconductor devices are susceptible to damage, malfunction, and the like caused by electrostatic discharge (ESD). Semiconductor devices with an electrostatic discharge protection function have therefore been proposed.

For example, ESD protection semiconductor devices with a diode structure including a p-type region and an n-type region have been proposed. ESD protection semiconductor devices with a thyristor structure including vertical NPN transistors and lateral PNP transistors have also been proposed. ESD protection semiconductor devices with an n-type Metal-Oxide Semiconductor (MOS) transistor structure have also been proposed.

RELATED PATENT DOCUMENTS

Japanese Patent Application Laid-Open 2004-221569
JP-A No. 2003-179150
JP-A No. 2011-71327

SUMMARY

According to an aspect of the embodiments, a semiconductor device includes: a first semiconductor region that has an external profile including at least one corner, and that includes a semiconductor of a first conductivity type; a first insulation region that surrounds an outer periphery of the first semiconductor region, and that includes an insulator that, at a corner portion corresponding to the corner, has a depth deeper than a depth at a location other than the corner portion; a second semiconductor region that surrounds an outer periphery of the first insulation region, and that includes a semiconductor of a second conductivity type that is different from the first conductivity type; and a second insulation region that surrounds an outer periphery of the second semiconductor region, and that includes an insulator that is deeper than the depth of the first insulation region at the location other than the corner portion.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 8 is a plan view illustrating a configuration of an integrated circuit including a semiconductor device according to an exemplary embodiment of technology disclosed herein.

DESCRIPTION OF EMBODIMENTS

Figure 1:
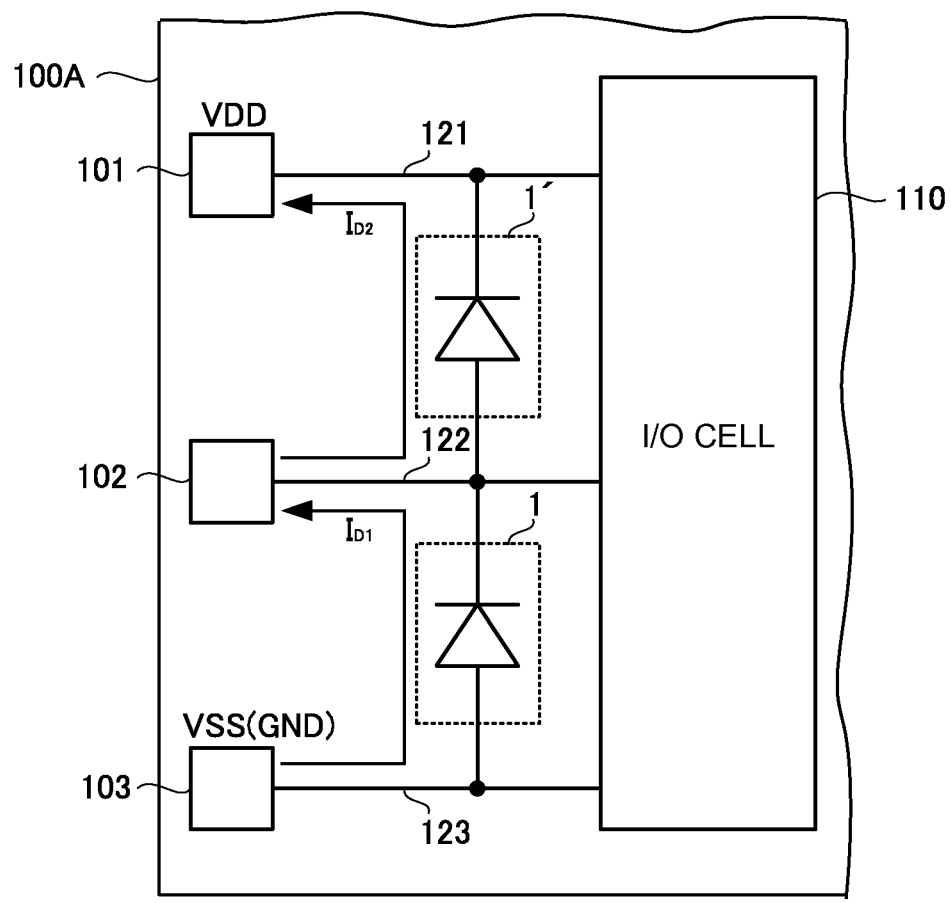
FIG. 1 is a drawing illustrating a configuration of an integrated circuit including a semiconductor device 1 according to an exemplary embodiment of technology disclosed herein.

In ESD protection semiconductor devices, there is a concern that if a region is present where discharge current due to electrostatic discharge is locally concentrated, this region may suffer thermal destruction. In ESD protection semiconductor devices, it is therefore desirable for discharge current due to electrostatic discharge to flow evenly. Suppressing localized concentration of discharge current due to electrostatic discharge enables an increase in the ESD tolerance of the ESD protection semiconductor device itself.

In ESD protection semiconductor devices, discharge performance is improved by reducing the resistance of current paths along which discharge current flows. The magnitude of the discharge current is determined by ESD criteria, and so increasing the discharge performance of an ESD protection semiconductor device enables a reduction in size of the semiconductor device.

Explanation follows regarding examples of exemplary embodiments of technology disclosed herein, with reference to the drawings. Identical or equivalent configuration elements and portions are allocated the same reference numerals in each of the drawings.

First Exemplary Embodiment

FIG. 1 illustrates a utilization example of a semiconductor device 1 provided with an ESD protection function according to a first exemplary embodiment of technology disclosed herein, and is a diagram illustrating a configuration of an integrated circuit 100A including the semiconductor device 1. The integrated circuit 100A includes the ESD protection semiconductor device 1, an input/output cell (I/O cell) 110 serving as an example of a protection target circuit protected by the semiconductor device 1, and electrode pads 101, 102, 103. The electrode pad 101 is a power source terminal for supplying a power source to the input/output cell (I/O cell) 110, and is connected to the input/output cell (I/O cell) 110 through a power source line 121. The electrode pad 102 is a signal terminal for transmission and reception of signals to and from the input/output cell (I/O cell) 110, and is connected to the input/output cell (I/O cell) 110 through a signal line 122. The electrode pad 103 is a ground terminal for supplying an earth potential (ground potential) to the input/output cell (I/O cell) 110, and is connected to the input/output cell (I/O cell) 110 through a ground line 123.

In the example illustrated in FIG. 1, the two semiconductor devices 1 and 1' that each have a diode structure are employed to protect the input/output cell (I/O cell) 110 from electrostatic discharge occurring through the electrode pads 101 to 103. The anode of the semiconductor device 1' situated at the top (on the power source (VDD) side) in FIG. 1 is connected to the signal line 122, and the cathode is connected to the power source line 121. The anode of the semiconductor device 1 situated at the bottom (on the ground (VSS) side) in FIG. 1 is connected to the ground line 123, and the cathode is connected to the signal line 122.

For example, in an electrostatic discharge occurs in which the electrode pad 102 attains a lower potential than the electrode pads 103, a discharge current $I_{D1}$ flows through the semiconductor device 1 situated at the bottom (on the ground (VSS) side) in FIG. 1. The discharge current $I_{D1}$ is accordingly suppressed from flowing into the input/output cell (I/O cell) 110. On the other hand, when an electrostatic discharge occurs in which the electrode pad 101 attains a lower potential than the electrode pad 102, a discharge current $I_{D2}$ flows through the semiconductor device 1' situated at the top (on the power source (VDD) side) in FIG. 1. The discharge current $I_{D2}$ is accordingly suppressed from flowing into the input/output cell (I/O cell) 110.

In the example illustrated in FIG. 1, the two semiconductor devices 1 and 1' are employed with the input/output cell (I/O cell) 110 serving as the protection target circuit; however one, or two or three or more of the semiconductor devices 1 and 1' may be employed with a single protection target circuit, depending on the terminal configuration and the like of the protection target circuit. In the example illustrated in FIG. 1, an example configuration is illustrated in which the semiconductor device 1' is connected to the power source line 121 and the signal line 122, and the semiconductor device 1 is connected to the signal line 122 and the ground line 123; however the semiconductor devices 1 and 1' may be connected to desired sites for forming a desired electrostatic discharge bypass path. The input/output cell (I/O cell) 110 is given as an example of the protection target circuit; however the protection target circuit may be any circuit. The semiconductor devices 2, 3 and 4 of the second to fourth exemplary embodiments described later may also be applied to the utilization example of the semiconductor device 1 illustrated in FIG. 1.

Figure 2:
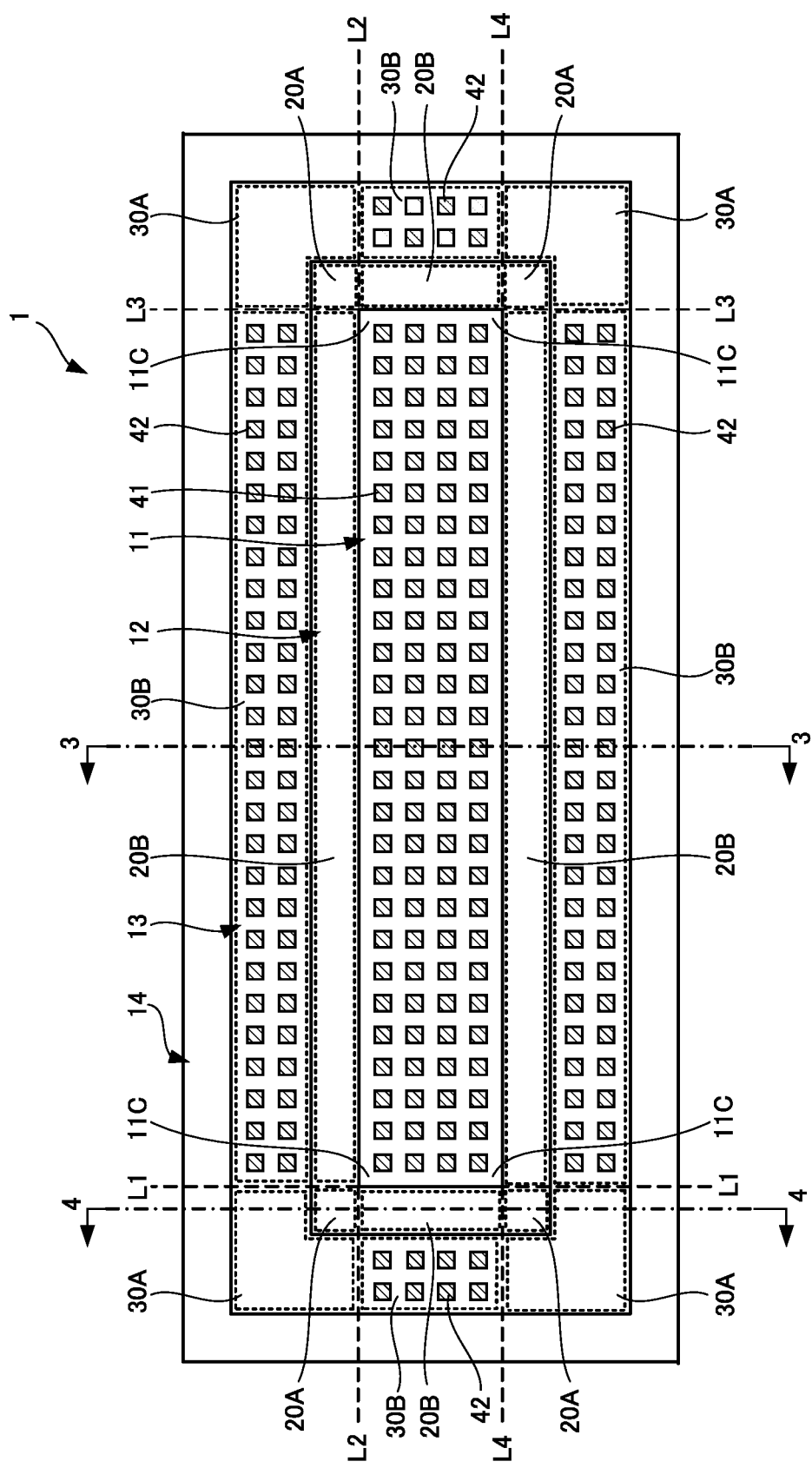
FIG. 2 is a plan view illustrating a configuration of a semiconductor device according to an exemplary embodiment of technology disclosed herein.
Figure 3:
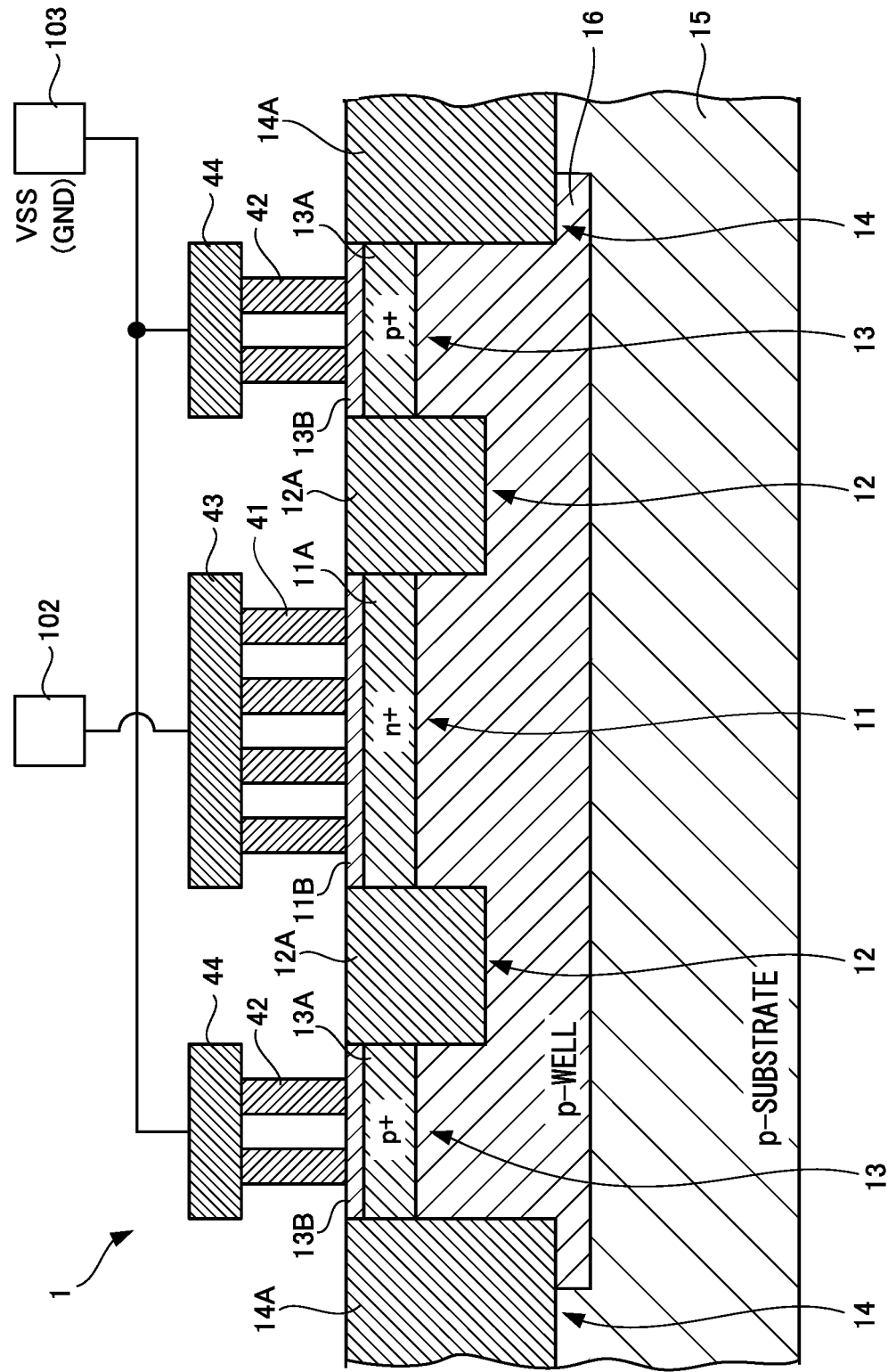
FIG. 3 is a cross-section taken along line 3-3 in FIG. 2.

FIG. 2 is a plan view illustrating a configuration of the semiconductor device 1, and FIG. 3 is a cross-section taken along line 3-3 in FIG. 2. As an example, FIG. 3 illustrates circuit connections corresponding to the semiconductor device 1 situated on the bottom (on the ground (VSS) side) in FIG. 1.

The semiconductor device 1 includes a cathode region 11 with a rectangular shaped external profile with four corners (vertices) 11C, and a rectangular ring shaped first insulation region 12 surrounding the outer periphery of the cathode region 11. The semiconductor device 1 further includes a rectangular ring shaped anode region 13 surrounding the outer periphery of the first insulation region 12, and a rectangular ring shaped second insulation region 14 surrounding the outer periphery of the anode region 13. Note that the cathode region 11 is an example of a first semiconductor region of technology disclosed herein. The anode region 13 is an example of a second semiconductor region of technology disclosed herein. The first insulation region 12 is an example of a first insulation region of technology disclosed herein. The second insulation region 14 is an example of a second insulation region of technology disclosed herein.

As illustrated in FIG. 3, the semiconductor device 1 includes a p-type substrate 15, and a p-well 16 with p-type conductivity, provided over the substrate 15. The substrate 15 may, for example, be a silicon substrate. The cathode region 11 includes an n-type semiconductor 11A formed in the surface portion of the p-well 16. The n-type semiconductor 11A may, for example, be formed by doping the surface of the p-well 16 with a group 5 element such as phosphorous or arsenic using an ion injection method. The cathode region 11 includes a silicide layer 11B provided over the n-type semiconductor 11A. Plural contacts 41 that are electrically connected to the silicide layer 11B are provided on the surface of the cathode region 11. The plural contacts 41 are electrically connected to the electrode pad 102 through a metal line 43 forming the signal line 122 (see FIG. 1).

The anode region 13 includes a p-type semiconductor 13A formed in the surface portion of the p-well 16. The p-type semiconductor 13A may, for example, be formed by doping the surface of the p-well 16 with a group 3 element such as boron using an ion injection method. The anode region 13 includes a silicide layer 13B provided over the p-type semiconductor 13A. Plural contacts 42 that are electrically connected to the silicide layer 13B are provided on the surface of the anode region 13. The plural contacts 42 are connected to the electrode pad 103 through a metal line 44 forming the ground line 123 (see FIG. 1).

The first insulation region 12 extending between the cathode region 11 and the anode region 13 includes an insulator 12A formed from $SiO_2$ or the like using a Shallow Trench Isolation (STI) process, for example. The first insulation region 12 has a role of restricting current paths flowing between the cathode region 11 and the anode region 13.

The second insulation region 14 surrounding the outer periphery of the anode region 13 includes an insulator 14A formed from $SiO_2$ or the like using an STI process, for example. The second insulation region 14 functions as a device isolation layer that electrically isolates the semiconductor device 1 from other semiconductor elements disposed outside the semiconductor device 1.

As illustrated in FIG. 2, the first insulation region 12 includes corner portions 20A corresponding to the respective corners 11C of the cathode region 11, and straight line portions 20B extending in straight lines following each edge of the cathode region 11. In the present exemplary embodiment, respective portions of the first insulation region 12 extending between extension lines of two respective adjacent edges of the cathode region 11 (L1 and L2, L1 and L4, L3 and L2, and L3 and L4) configure the corner portions 20A of the first insulation region 12. Portions of the first insulation region 12 other than the corner portions 20A, namely portions between opposing edges of the cathode region 11 and the anode region 13, configure the straight line portions 20B of the first insulation region 12.

Similarly, the anode region 13 includes corner portions 30A corresponding to the respective corners 11C of the cathode region 11, and straight line portions 30B extending in straight lines following each edge of the cathode region 11. In the present exemplary embodiment, respective portions of the anode region 13 extending between the extension lines of two respective adjacent edges of the cathode region 11 (L1 and L2, L1 and L4, L3 and L2, and L3 and L4) configure the corner portions 30A of the anode region 13. Portions of the anode region 13 other than the corner portions 30A, namely the respective portions extending in straight line shapes following each edge of the cathode region 11, configure the straight line portions 30B of the anode region 13. In the semiconductor device 1, the contacts 42 are not connected to the respective corner portions 30A of the anode region 13. Namely, the respective contacts 42 are connected to the straight line portions 30B of the anode region 13.

Figure 4:
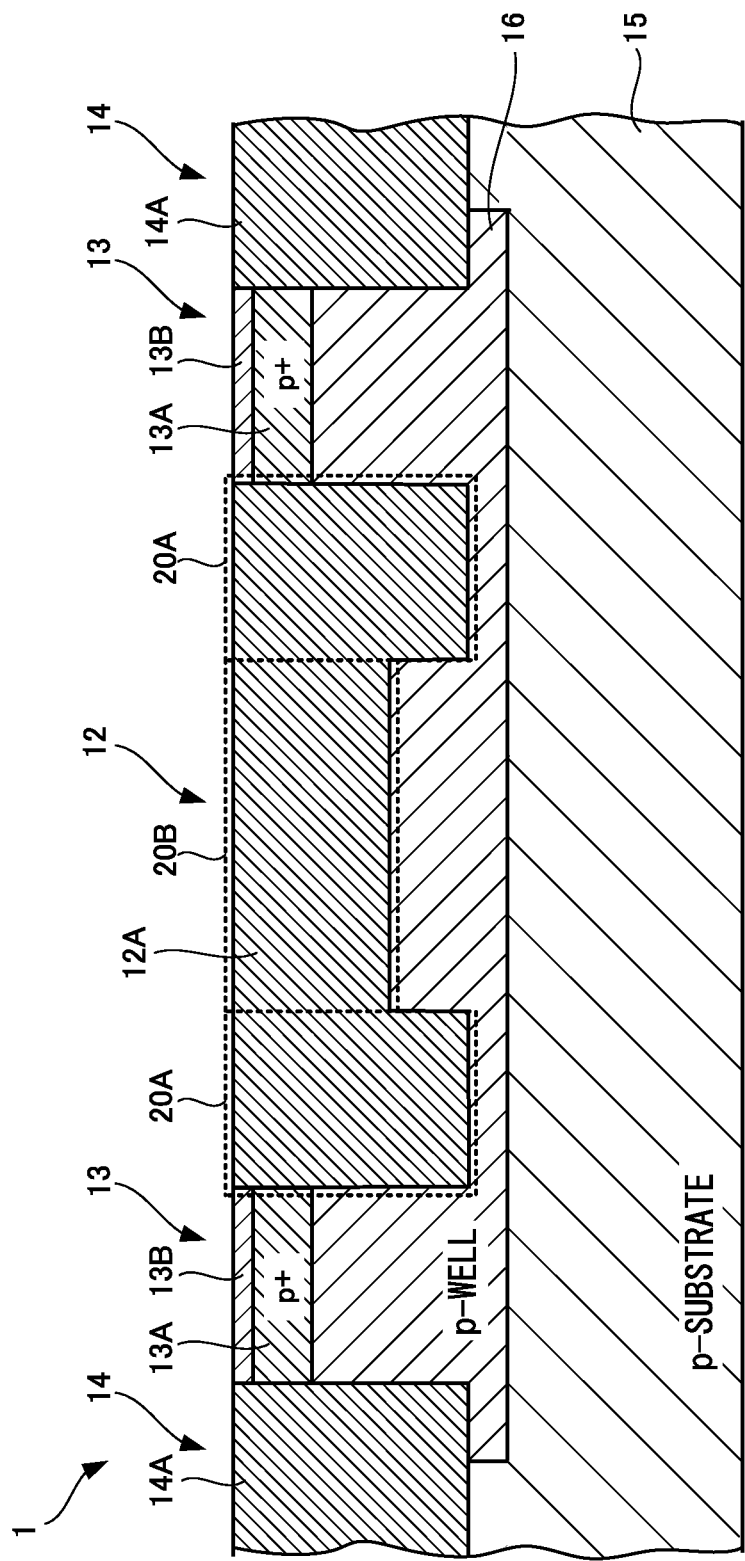
FIG. 4 is a cross-section taken along line 4-4 in FIG. 2.

FIG. 4 is a cross-section taken along line 4-4 in FIG. 2, passing through the corner portions 20A and one straight line portion 20B of the first insulation region 12. As illustrated in FIG. 4, the depth of the insulator 12A at the corner portions 20A of the first insulation region 12 is deeper than the depth of the insulator 12A at the straight line portion 20B. Moreover, the depth of the insulator 12A at the straight line portion 20B of the first insulation region 12 is shallower than the depth of the insulator 14A of the second insulation region 14. Namely, the straight line portion 20B of the first insulation region 12 has a partial trench structure. The bottom face of the insulator 12A at the straight line portion 20B of the first insulation region 12 may, for example, be disposed in the vicinity of, or above, a central position of the p-well 16 in the depth direction. The depth of the insulator 12A at the corner portions 20A of the first insulation region 12 may be the same as the depth of the insulator 14A of the second insulation region 14.

Figure 5:
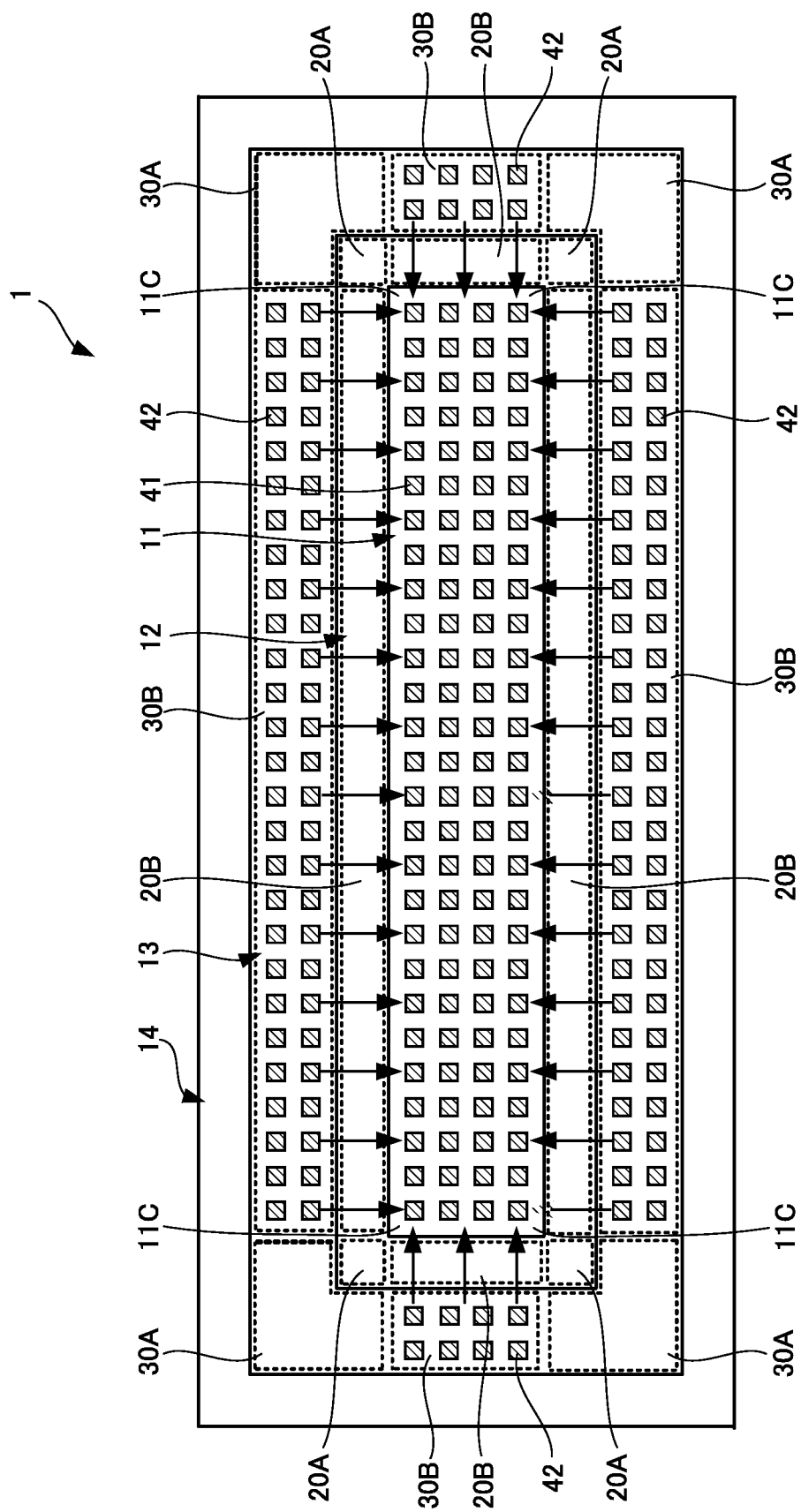
FIG. 5 is a plan view illustrating paths of discharge current during electrostatic discharge in a semiconductor device according to an exemplary embodiment of technology disclosed herein.
Figure 6:
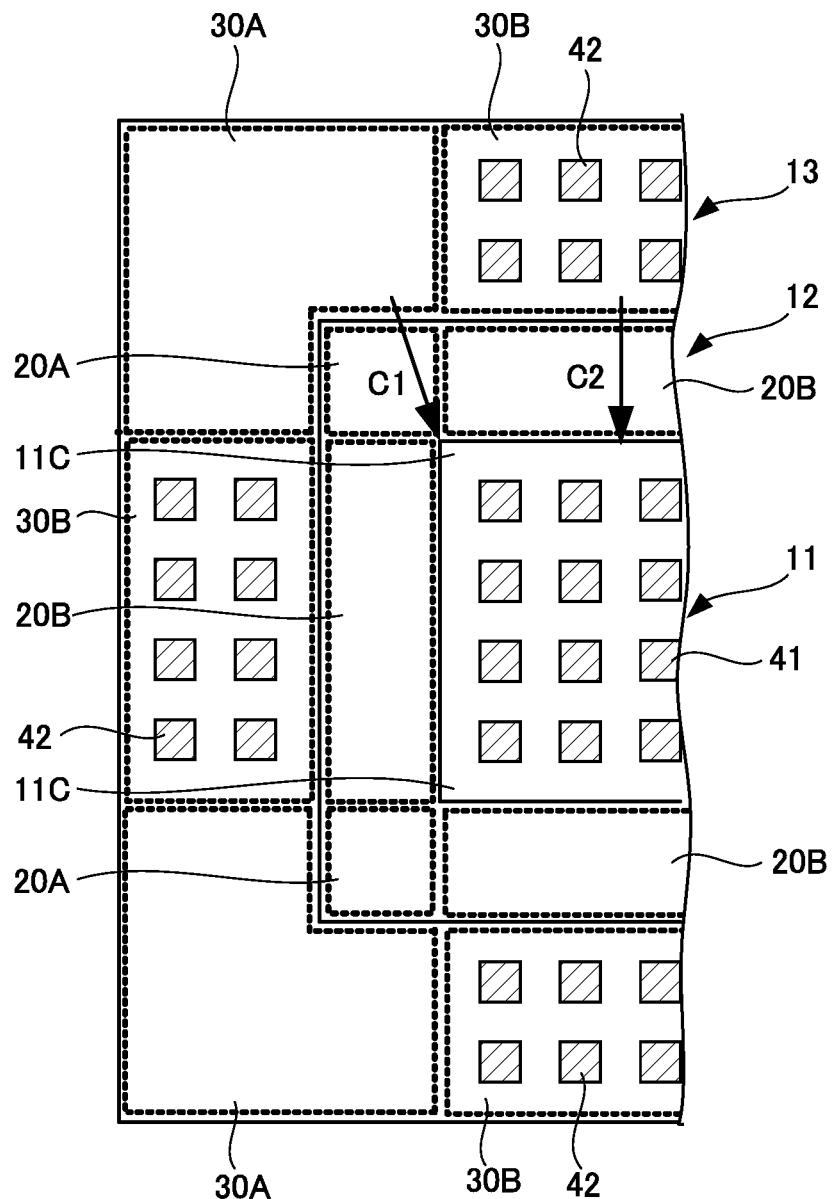
FIG. 6 is a plan view illustrating paths of discharge current during electrostatic discharge in a semiconductor device according to an exemplary embodiment of technology disclosed herein.

FIG. 5 and FIG. 6 are plan views illustrating discharge current paths during an electrostatic discharge in which the cathode region 11 attains a lower potential than the anode region 13. When an electrostatic discharge occurs in which the cathode region 11 attains a lower potential than the anode region 13, discharge current flows in the direction illustrated by the arrows in FIG. 5 and FIG. 6, namely from the anode region 13 toward the cathode region 11. Of such discharge current paths, FIG. 6 illustrates an example of a current path C1 crossing a corner portion 20A of the first insulation region 12, and a current path C2 crossing a straight line portion 20B of the first insulation region 12.

Figure 7A:
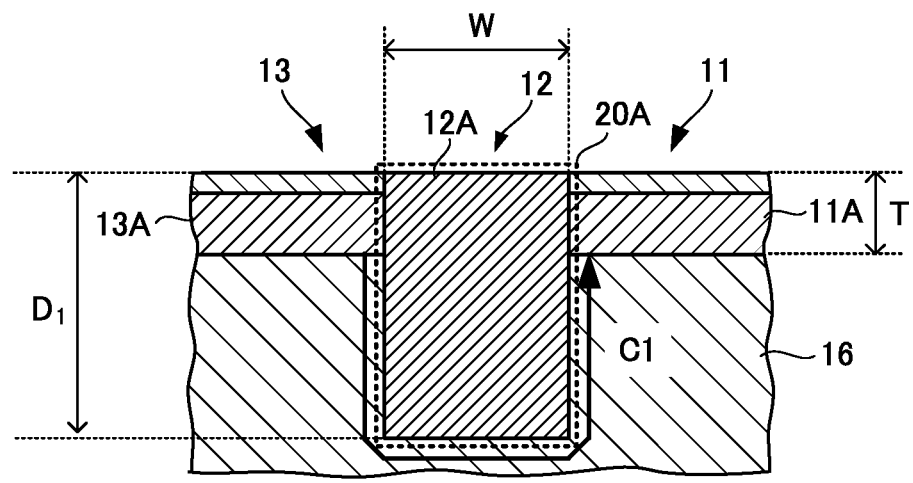
FIG. 7A is a cross-section taken along the current path C1 illustrated in FIG. 6.
Figure 7B:
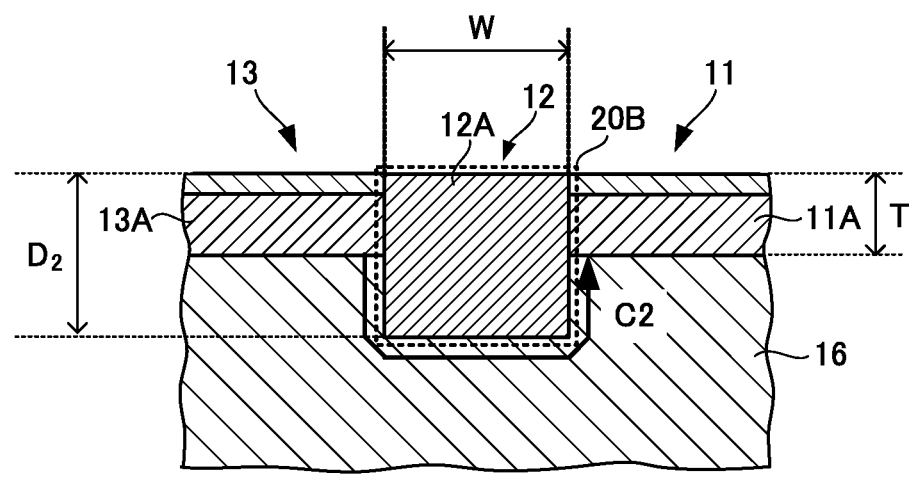
FIG. 7B is a cross-section taken along the current path C2 illustrated in FIG. 6.

FIG. 7A is a cross-section taken along the current path C1 in FIG. 6, and FIG. 7B is a cross-section taken along the current path C2 in FIG. 6. As illustrated in FIG. 7A and FIG. 7B, the discharge currents head from the p-type semiconductor 13A of the anode region 13 and under the insulator 12A of the first insulation region 12, toward the n-type semiconductor 11A of the cathode region 11. The current paths C1 and C2 illustrated in FIG. 7A and FIG. 7B represent the shortest paths from the anode region 13 to the cathode region 11. As described above, the depth of the insulator 12A at the corner portions 20A of the first insulation region 12 is deeper than the depth of the insulator 12A at the straight line portions 20B of the first insulation region 12. The length of the current path C1 passing under the corner portion 20A of the first insulation region 12 is therefore longer than the length of the current path C2 passing under the straight line portion 20B of the first insulation region 12. The resistance of the current path C1 is therefore greater than the resistance of the current path C2.

Out of the current paths formed between the anode region 13 and the cathode region 11 in the semiconductor device 1, the current path C1 passing under the corner portion 20A of the first insulation region 12 has a relatively high resistance. This thereby enables concentration of current at the respective corners 11C of the cathode region 11 and at the respective corner portions 30A of the anode region 13 during electrostatic discharge to be suppressed. Supposing the resistance of the current path C1 and the resistance of the current path C2 were the same, the current density at the respective corners 11C of the cathode region 11 and the respective corner portions 30A of the anode region 13 would become markedly higher than the current density at other locations. Generally speaking, the current density at corners of semiconductor regions is known to reach up to approximately 1.5 times that of the current density at other locations (source: Basic ESD and I/O design; Sanjay Dabral, Timothy J. Maloney). Namely, if the resistance of the current path C1 and the resistance of the current path C2 were equal to each other, thermal destruction would be liable to occur due to current being concentrated at the respective corners 11C of the cathode region 11 and at the respective corner portions 30A of the anode region 13 during electrostatic discharge. As a result, it would be difficult to achieve the desired ESD tolerance of the semiconductor device 1.

In the semiconductor device 1, as described above, the resistance of the current path C1 passing under the corner portion 20A of the first insulation region 12 is greater than the resistance of the current path C2 passing under the straight line portion 20B. Current is accordingly suppressed from concentrating at the respective corners 11C of the cathode region 11 and at the respective corner portions 30A of the anode region 13. Moreover, in the semiconductor device 1, the effect of suppressing a concentration of current at the respective corners 11C of the cathode region 11 and the respective corner portions 30A of the anode region 13 is further promoted since the respective corner portions 30A of the anode region 13 are not connected to the contacts 42. During electrostatic discharge in the semiconductor device 1, discharge current flows at substantially even density around the entire periphery of the cathode region 11, without localized concentration.

Explanation follows regarding the relationship between the depth of the insulator 12A at the corner portions 20A, and the depth of the insulator 12A at the straight line portions 20B, in the first insulation region 12, for effectively suppressing a concentration of current at the respective corners of the cathode region 11 and the anode region 13.

As described above, it is envisaged that the current density at the respective corners 11C of the cathode region 11 and the respective corner portions 30A of the anode region 13 could reach up to approximately 1.5 times the current density at other locations. Accordingly, as respectively illustrated in FIG. 6, FIG. 7A, and FIG. 7B, setting the resistance of the current path C1 to 1.5 times that of the current path C2 or greater enables such a concentration of current to be eliminated at the respective corners 11C of the cathode region 11 and the respective corner portions 30A of the anode region 13. Namely, a concentration of current can be eliminated by setting the depth of the insulator 12A at the corner portions 20A and the straight line portions 20B of the first insulation region 12 such that the length of the current path C1 is 1.5 times the length of the current path C2 or greater.

Here, the width of the insulator 12A in the direction of current flow is denoted W, and the depth of the n-type semiconductor 11A and the p-type semiconductor 13A is denoted T. The depth of the insulator 12A at the corner portions 20A of the first insulation region 12 is denoted $D_1$, and the depth of the insulator 12A at the straight line portions 20B of the first insulation region 12 is denoted $D_2$ (see FIG. 7A, FIG. 7B). In this example, the length $P_1$ of the current path C1 and the length $P_2$ of the current path C2 may be expressed using Equation (1) and Equation (2) respectively, given below.

$$P_1 = 2(D_1 - T) + W \quad (1)$$

$$P_2 = 2(D_2 - T) + W \quad (2)$$

When the length $P_1$ of the current path C1 is set to 1.5 times that of the length $P_2$ of the current path C2 or greater, the following Equation (3) and Equation (4) can be obtained.

$$P_1 \geq 1.5 P_2 \quad (3)$$

$$2(D_1 - T) + W \geq 3(D_2 - T) + 1.5W \quad (4)$$

Solving Equation (4) for $D_1$ gives the following Equation (5).

$$D_1 \geq (3D_2 - T + 0.5W)/2 \quad (5)$$

Namely, concentration of current at the respective corners 11C of the cathode region 11 and at the respective corner portions 30A of the anode region 13 during electrostatic discharge can be effectively suppressed when $D_1$ and $D_2$ satisfy Equation (5).

The straight line portion 20B of the first insulation region 12 has a partial trench structure where the depth of the insulator 12A is shallower than the depth of the insulator 14A of the second insulation region 14 that functions as a device isolation layer. The resistance of the current path passing under the straight line portion 20B can accordingly be made smaller than if the straight line portion 20B were configured with a normal trench structure. The semiconductor device 1 accordingly enables higher discharge performance than hitherto.

As described above, in the semiconductor device 1 according to the first exemplary embodiment of technology disclosed herein, the depth of the insulator 12A at the corner portions 20A of the first insulation region 12 is deeper that the depth of the insulator 12A at the straight line portions 20B. Moreover, the contacts 42 are not connected to the respective corner portions 30A of the anode region 13. The resistance of current paths passing under the straight line portions 20B of the first insulation region 12 is thus relatively small, and the resistance of current paths passing under the corner portions 20A of the first insulation region 12 is relatively large. Concentration of current at the respective corners 11C of the cathode region 11 and the respective corner portions 30A of the anode region 13 during electrostatic discharge can accordingly be suppressed, enabling the current density of the discharge current to be made substantially even around the entire periphery of the cathode region 11. Evening out the current density of the discharge current flowing in the semiconductor regions enables an increase in the ESD tolerance of the semiconductor device 1.

In the semiconductor device 1 according to the first exemplary embodiment of technology disclosed herein, the insulator 12A at the straight line portions 20B of the first insulation region 12 has a partial trench structure that is shallower than the depth of the insulator 14A of the second insulation region 14 that functions as a device isolation layer. This thereby enables the resistance of current paths of discharge current from the anode region 13, that pass under the straight line portions 20B of the first insulation region 12 toward the cathode region 11, to be made smaller than hitherto. This thereby enables higher discharge performance of the semiconductor device 1 than hitherto.

In the semiconductor device 1 according to the first exemplary embodiment of technology disclosed herein, localized concentration of the discharge current due to electrostatic discharge can accordingly be suppressed, and higher discharge performance can be obtained than hitherto. Note that the depth of the insulator 12A may be set deeper than the depth of the insulator 12A at the straight line portions 20B over the entire region of the corner portions 20A of the first insulation region 12. Alternatively, the depth of the insulator 12A may be set deeper than the depth of the insulator 12A at the straight line portions 20B over a partial range of the corner portions 20A of the first insulation region 12. The advantageous effect of suppressing concentration of current can be obtained even when the range where the depth of the insulator 12A of the first insulation region 12 is relatively deep is a partial range of the corner portions 20A.

Second Exemplary Embodiment

Figure 9:
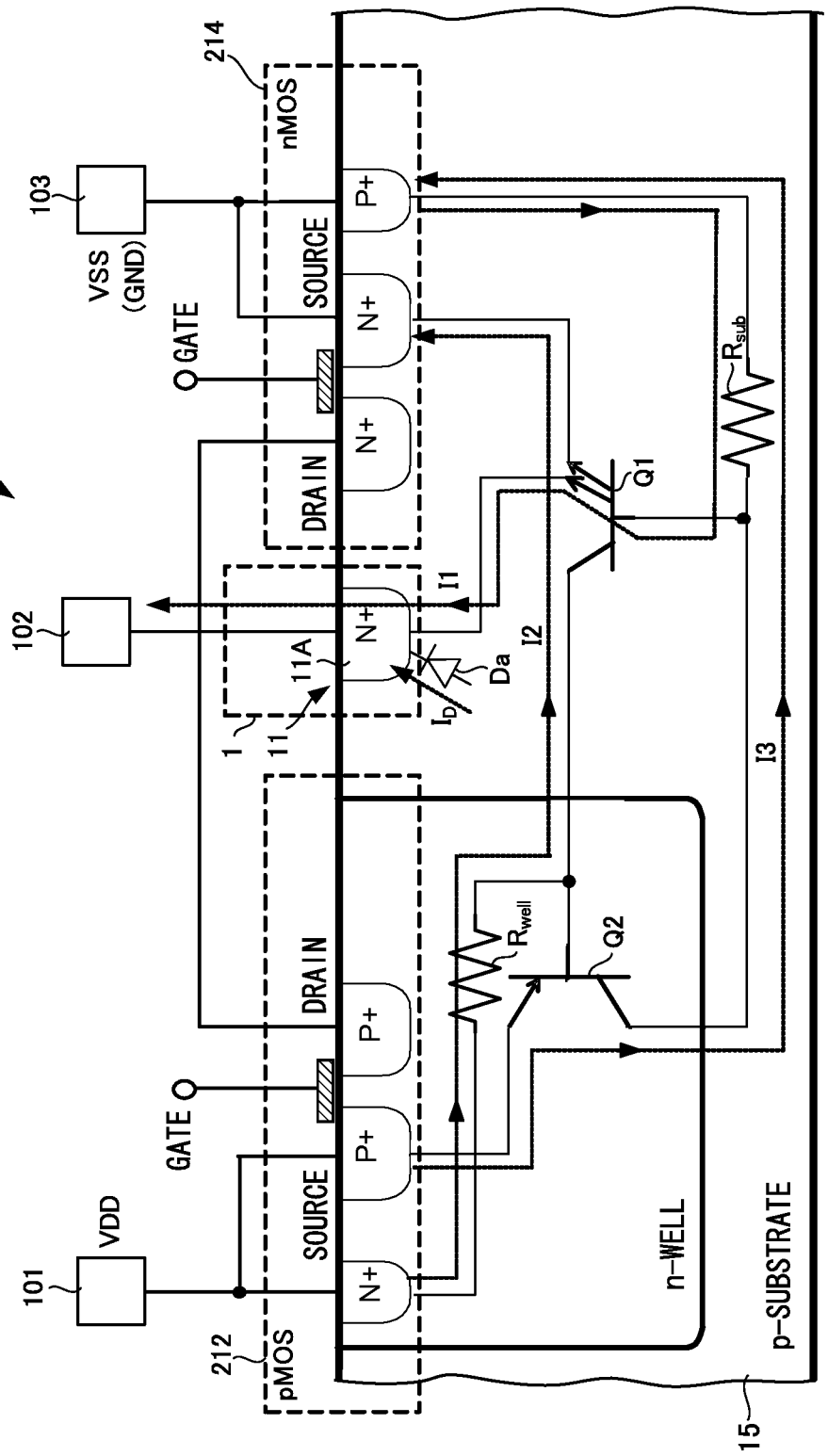
FIG. 9 is a schematic cross-section illustrating an integrated circuit including a semiconductor device according to an exemplary embodiment of technology disclosed herein.

FIG. 8 is a plan view illustrating a configuration of an integrated circuit 100B including the semiconductor device 1 according to the first exemplary embodiment described above. The integrated circuit 100B includes the semiconductor device 1, and plural CMOS (Complementary Metal-Oxide Semiconductor) circuits 210 disposed in the vicinity of the semiconductor device 1. Note that FIG. 8 omits configurations of protection target circuits protected by the semiconductor device 1, electrode pads, and the like. If the CMOS circuits 210 are disposed in the vicinity of the semiconductor device 1, there is a concern of a latch-up occurring triggered by a discharge current $I_D$ flowing between the CMOS circuits 210 and the semiconductor device 1 during electrostatic discharge. Explanation follows regarding the mechanism by which a latch-up occurs, with reference to FIG. 9. FIG. 9 is a schematic cross-section of the integrated circuit 100B. Note that FIG. 9 omits all configuration elements of the semiconductor device 1 except for the n-type semiconductor 11A, so as to avoid complicating the drawing.

The CMOS circuits 210 each include a p-channel MOSFET (Metal-Oxide-Semiconductor Field-Effect Transistor) 212 with its source connected to the electrode pad 101 that is the power source terminal, and an n-channel MOSFET 214 with its source connected to the electrode pad 103 that is the ground terminal. When an electrostatic discharge occurs in which the electrode pad 102 (cathode region 11) attains a lower potential than the electrode pad 103 (anode region 13), a parasitic diode Da formed between the p-type substrate 15 and the n-type semiconductor 11A of the cathode region 11 of the semiconductor device 1 becomes conduction state. The discharge current $I_D$ accordingly flows toward the electrode pad 102. The majority of the discharge current $I_D$ forms a base current I1 of a parasitic npn transistor Q1, and an ON state of the parasitic npn transistor arises. A collector current I2 accordingly flows in the parasitic npn transistor Q1. The collector current I2 flows in a resistor $R_{well}$ formed between the electrode pad 101 applied with the power source voltage VDD, and the base of a parasitic pnp transistor Q2, and a potential difference arises across the resistor $R_{well}$. The base of the parasitic pnp transistor Q2 is accordingly biased, such that an ON state of the parasitic pnp transistor Q2 arises, causing a collector current I3 of the parasitic pnp transistor Q2 to flow. When the collector current I3 flows in a resistor $R_{sub}$ formed between the base of the parasitic npn transistor Q1 and the electrode pad 103 applied with the ground potential, a potential difference arises across the resistor $R_{sub}$. The base of the parasitic npn transistor Q1 is therefore biased, maintaining the ON state of the parasitic npn transistor Q1. The ON state of the parasitic pnp transistor Q2 is also maintained as a result. When the CMOS circuits 210 are disposed in the vicinity of the semiconductor device 1, there is accordingly a possibility of causing a latch-up triggered by the discharge current $I_D$ due to electrostatic discharge, in which ON states of the parasitic npn transistor Q1 and the parasitic pnp transistor Q2 persist. The discharge current $I_D$ triggering the latch-up flows across the corner portions 30A of the anode region 13, which is not connected to the contacts 42, toward the cathode region 11, as illustrated in FIG. 8.

An example of a method for suppressing the occurrence of latch-up as described above is a method in which the distance between the CMOS circuits 210 and the semiconductor device 1 is increased. The base current I1 of the parasitic npn transistor Q1 (see FIG. 9) during electrostatic discharge is accordingly reduced, such that an ON state of the parasitic npn transistor Q1 is less liable arise, enabling the occurrence of latch-up to be suppressed.

Figure 10:
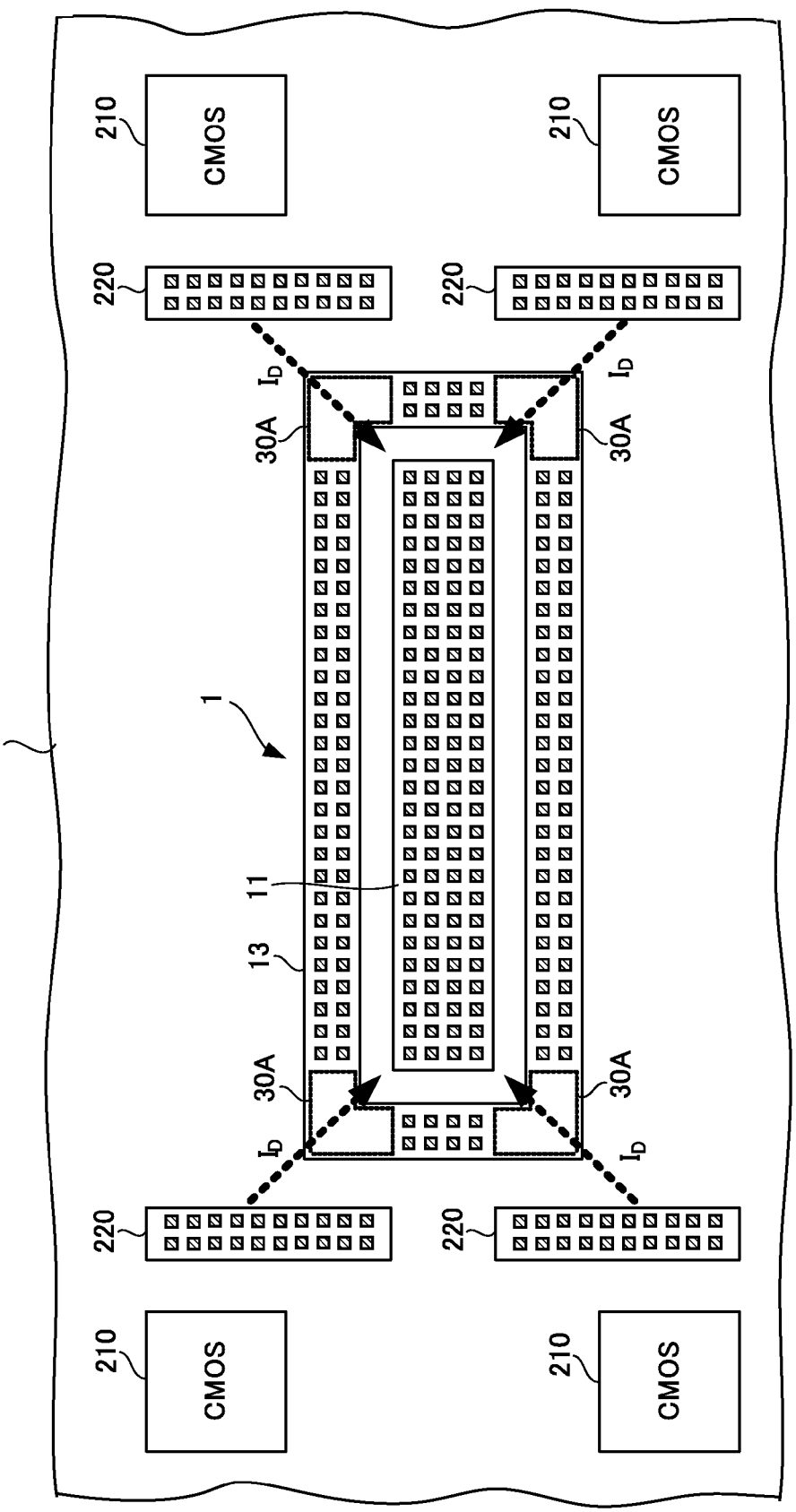
FIG. 10 is a plan view illustrating a configuration of an integrated circuit including a semiconductor device according to an exemplary embodiment of technology disclosed herein.
Figure 11:
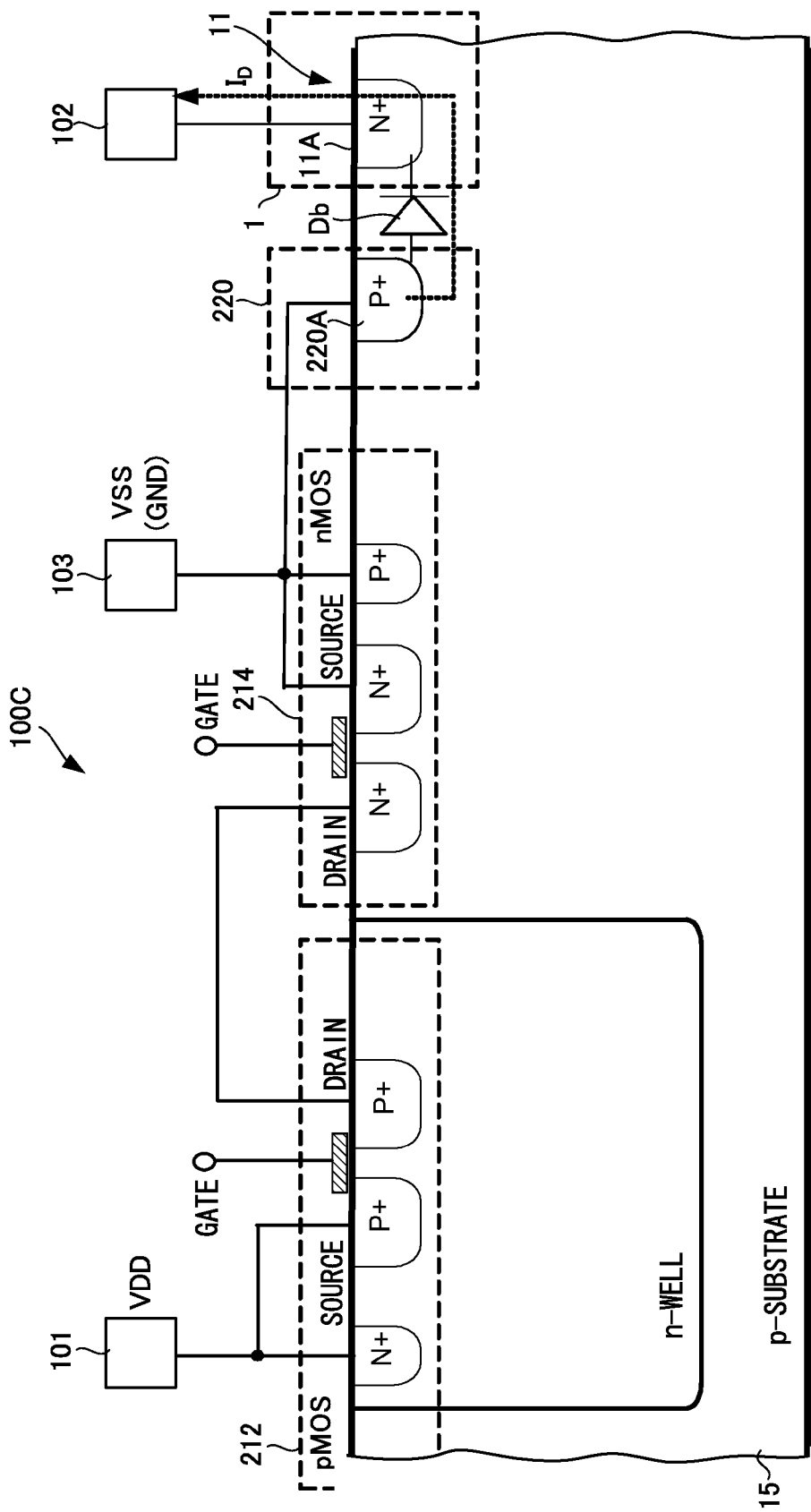
FIG. 11 is a schematic cross-section illustrating an integrated circuit including a semiconductor device according to an exemplary embodiment of technology disclosed herein.

Another example of a method for suppressing the occurrence of latch-up is a method in which a substrate contact region is formed between the semiconductor device 1 and the CMOS circuits 210. FIG. 10 is a plan view illustrating a configuration of an integrated circuit 100C in which substrate contact regions 220 are provided between the semiconductor device 1 and the CMOS circuits 210. FIG. 11 is a schematic cross-section of the integrated circuit 100C. Note that FIG. 11 omits all configuration elements of the semiconductor device 1 except for the n-type semiconductor 11A, so as to avoid complicating the drawing.

As illustrated in FIG. 11, the substrate contact region 220 includes a p-type semiconductor 220A connected to the electrode pad 103 that is applied with the ground potential. Disposing the substrate contact region 220 in the vicinity of the semiconductor device 1 forms a diode Db, of which the p-type semiconductor 220A of the substrate contact region 220 serves as the anode, and the n-type semiconductor 11A of the cathode region 11 of the semiconductor device 1 serves as the cathode. In this example, the discharge current $I_D$ flows in the diode Db when electrostatic discharge occurs in which the electrode pad 102 (cathode region 11) attains a lower potential than the electrode pad 103 (anode region 13). Current is therefore less readily supplied to the base of the parasitic npn transistor Q1 (see FIG. 9) during electrostatic discharge, making an ON state of the parasitic npn transistor Q1 less liable to arise, suppressing the occurrence of latch-up. Namely, the discharge current $I_D$ that could otherwise trigger latch-up flows from the substrate contact region 220 toward the cathode region 11 of the semiconductor device 1 as illustrated in FIG. 10, thereby enabling the discharge current $I_D$ to be prevented from being drawn out of the CMOS circuits 210.

However, both approaches to suppressing the occurrence of latch-up described above result in an increased surface area of the integrated circuit. A semiconductor device according to a second exemplary embodiment of technology disclosed herein has a configuration capable of suppressing the occurrence of latch-up without entailing an increase in the surface area of an integrated circuit.

Figure 12:
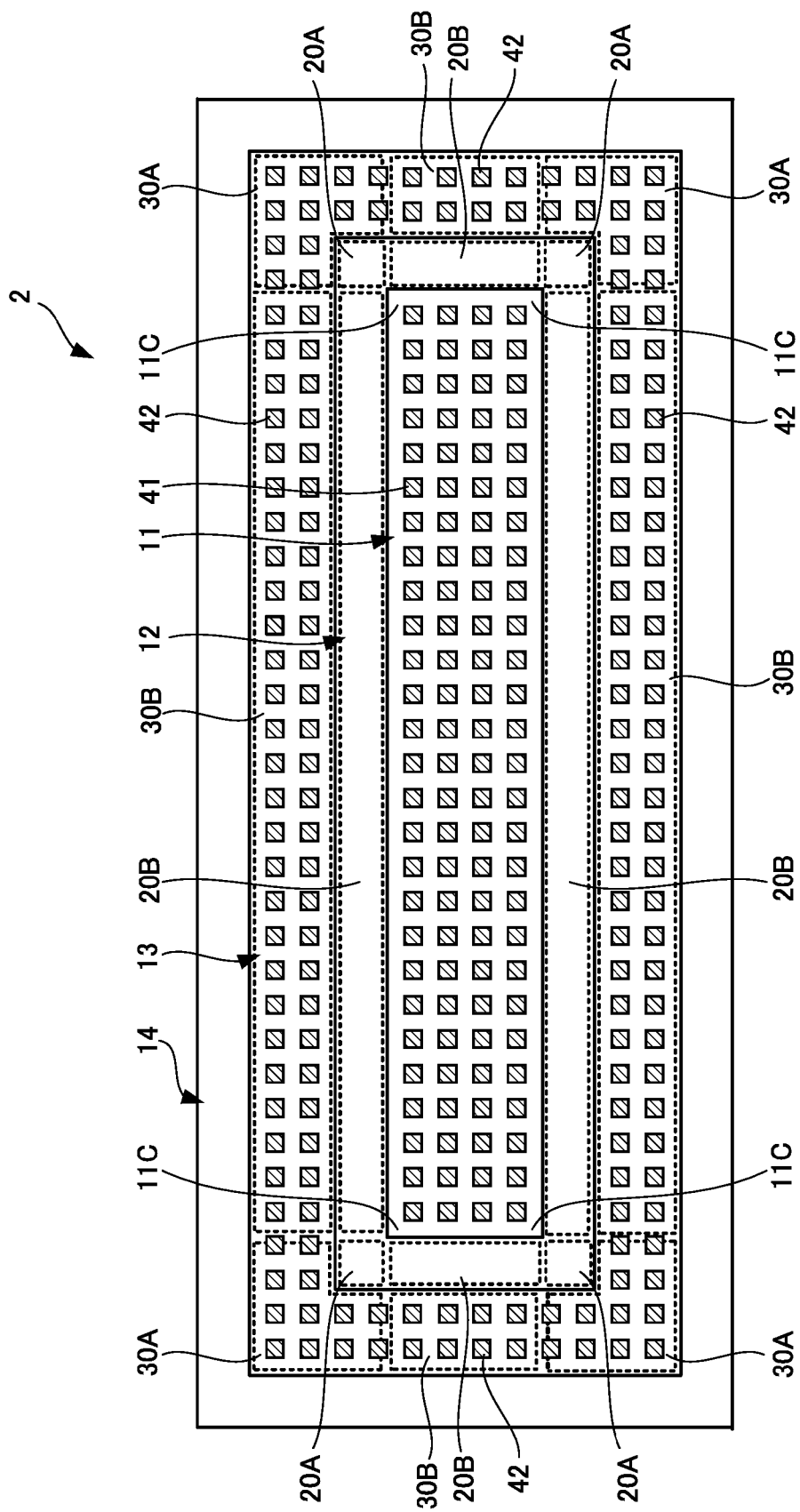
FIG. 12 is a plan view illustrating a configuration of a semiconductor device according to an exemplary embodiment of technology disclosed herein.

FIG. 12 is a plan view illustrating a configuration of a semiconductor device 2 according to the second exemplary embodiment of technology disclosed herein. In FIG. 12, configuration elements the same as or corresponding to those of the semiconductor device 1 according to the first exemplary embodiment are allocated the same reference numerals, and detailed explanation thereof is omitted. The semiconductor device 2 according to the second exemplary embodiment differs from the semiconductor device 1 according to the first exemplary embodiment in that the contacts 42 are connected to the corner portions 30A, rather than only to the straight line portions 30B, of the anode region 13. In the semiconductor device 2 according to the second exemplary embodiment, the density of the contacts 42 at the corner portions 30A of the anode region 13 is the same as the density of the contacts 42 at the straight line portions 30B of the anode region 13. Providing the contacts 42 across the entire anode region 13 in this manner enables similar advantageous effects to when the substrate contact regions 220 are disposed in the vicinity of the semiconductor device 1 of the first exemplary embodiment (see FIG. 10).

Figure 13:
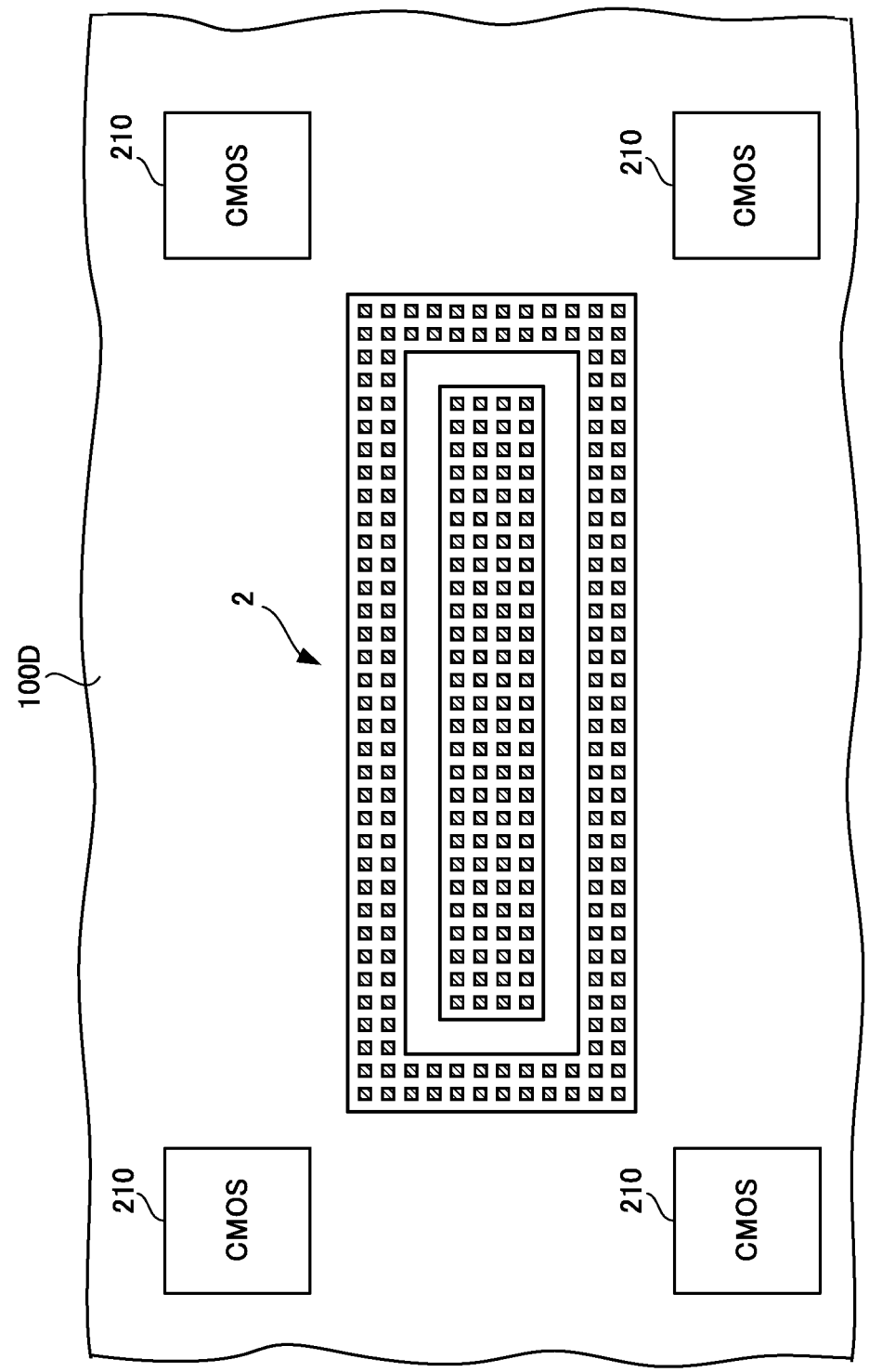
FIG. 13 is a plan view illustrating a configuration of an integrated circuit including a semiconductor device according to an exemplary embodiment of technology disclosed herein.
Figure 14:
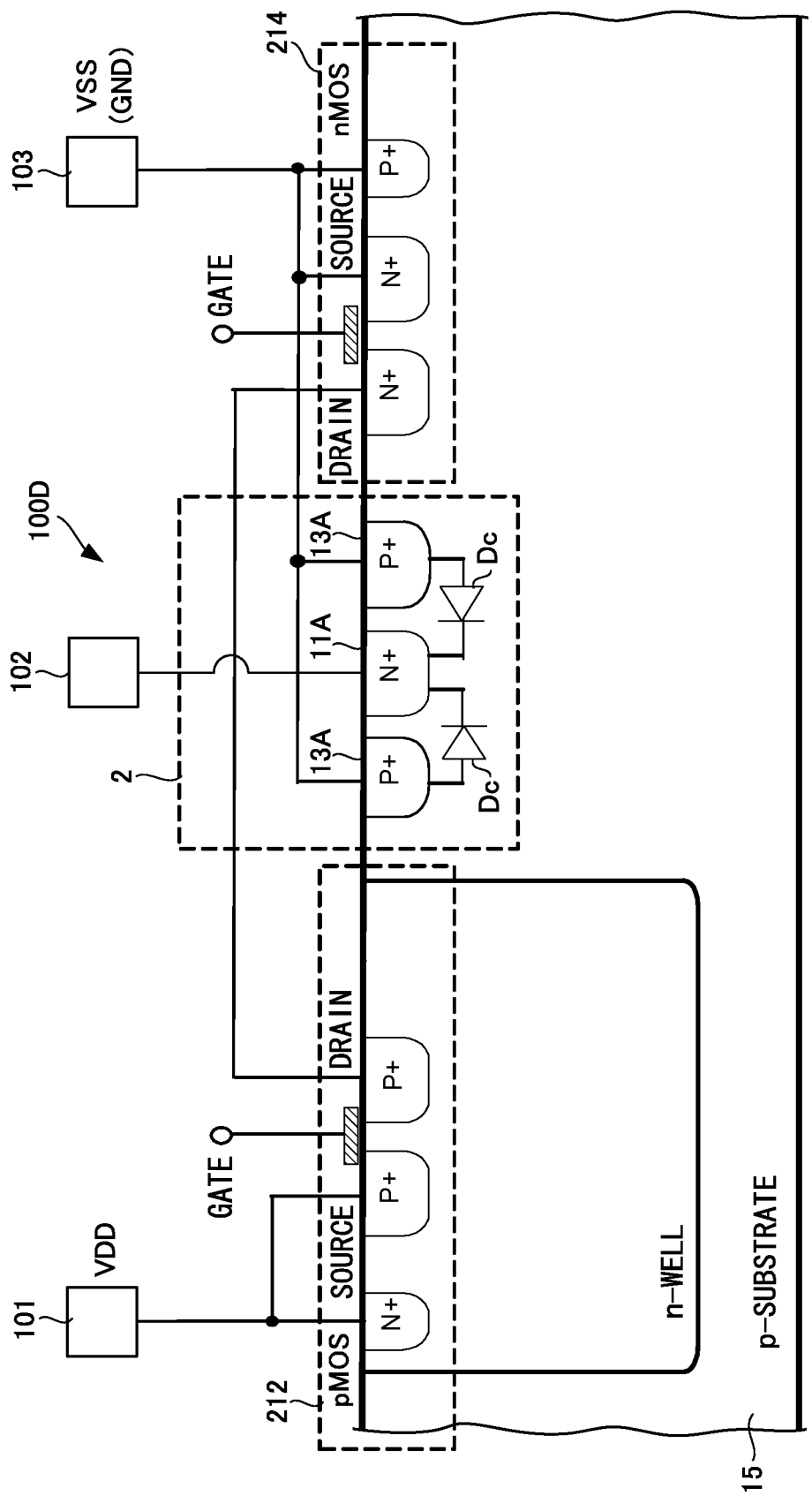
FIG. 14 is a schematic cross-section illustrating an integrated circuit including a semiconductor device according to an exemplary embodiment of technology disclosed herein.

FIG. 13 is a plan view illustrating a configuration of an integrated circuit 100D including the semiconductor device 2 and plural CMOS circuits 210 disposed in the vicinity of the semiconductor device 2. Note that FIG. 13 omits configurations of protection target circuits protected by the semiconductor device 2, electrode pads, and the like. FIG. 14 is a schematic cross-section of the integrated circuit 100D. Note that FIG. 14 omits all configuration elements of the semiconductor device 2 except for an n-type semiconductor 11A and a p-type semiconductor 13A, so as to avoid complicating the diagram.

The resistance of diodes Dc, formed by the p-type semiconductor 13A at the corner portions 30A and the n-type semiconductor 11A of the cathode region 11, is small due to connecting the contacts 42 to the corner portions 30A of the anode region 13. The discharge current $I_D$ is therefore not readily drawn from outside the semiconductor device 2 even when an electrostatic discharge occurs in which the electrode pad 102 (cathode region 11) attains a lower potential than the electrode pad 103 (anode region 13). Namely, the discharge current $I_D$ can be prevented from being drawn out from the CMOS circuits 210 due to connecting the contacts 42 to the corner portions 30A of the anode region 13. An ON state of the parasitic npn transistor Q1 (see FIG. 9) therefore does not readily arise, suppressing the occurrence of latch-up. The semiconductor device 2 according to the second exemplary embodiment enables the occurrence of latch-up to be suppressed without increasing the distance between the semiconductor device 2 and the CMOS circuits 210, or providing substrate contact regions between the semiconductor device 2 and the CMOS circuits 210. Namely, the occurrence of latch-up can be suppressed without entailing an increase in the surface area of the integrated circuit.

Note that the advantageous effect of suppressing a concentration of current at the corners 11C of the cathode region 11 and the corner portions 30A of the anode region 13 is diminished in comparison to the first exemplary embodiment due to also connecting the contacts 42 to the corner portions 30A of the anode region 13. However, in the semiconductor device 2 according to the second exemplary embodiment, the depth of the insulator 12A at the corner portions 20A of the first insulation region 12 is again deeper that the depth of the insulator 12A at the straight line portions 20B. The semiconductor device 2 according to the second exemplary embodiment therefore retains the advantageous effect of suppressing a concentration of current at the respective corners 11C of the cathode region 11 and the respective corner portions 30A of the anode region 13, albeit to a lesser extent than in the first exemplary embodiment. In other words, setting the depth of the insulator 12A at the corner portions 20A of the first insulation region 12 deeper than the depth of the insulator 12A at the straight line portions 20B enables the advantageous effect of suppressing a concentration of current at the respective corner portions of the cathode region 11 and the anode region 13 to be secured. ESD tolerance of a specific level or higher can accordingly be maintained, even with the contacts 42 disposed in the corner portions 30A of the anode region 13.

As described above, the semiconductor device 2 according to the second exemplary embodiment of technology disclosed herein enables higher discharge performance to be obtained than hitherto, as well as suppressing localized concentration of discharge current due to electrostatic discharge, similarly to the semiconductor device 1 according to the first exemplary embodiment. The occurrence of latch-up triggered by discharge current during electrostatic discharge can also be suppressed, even when CMOS circuits are disposed in the vicinity of the semiconductor device 2. The placement of the semiconductor device 2 and the accompanying protection target circuit (for example, an I/O cell) within the integrated circuit can therefore be decided freely. This thereby enables an integrated circuit to be laid out with high surface area efficiency, enabling a reduction in the size of the semiconductor chip mounted with the integrated circuit.

Third Exemplary Embodiment

Figure 15:
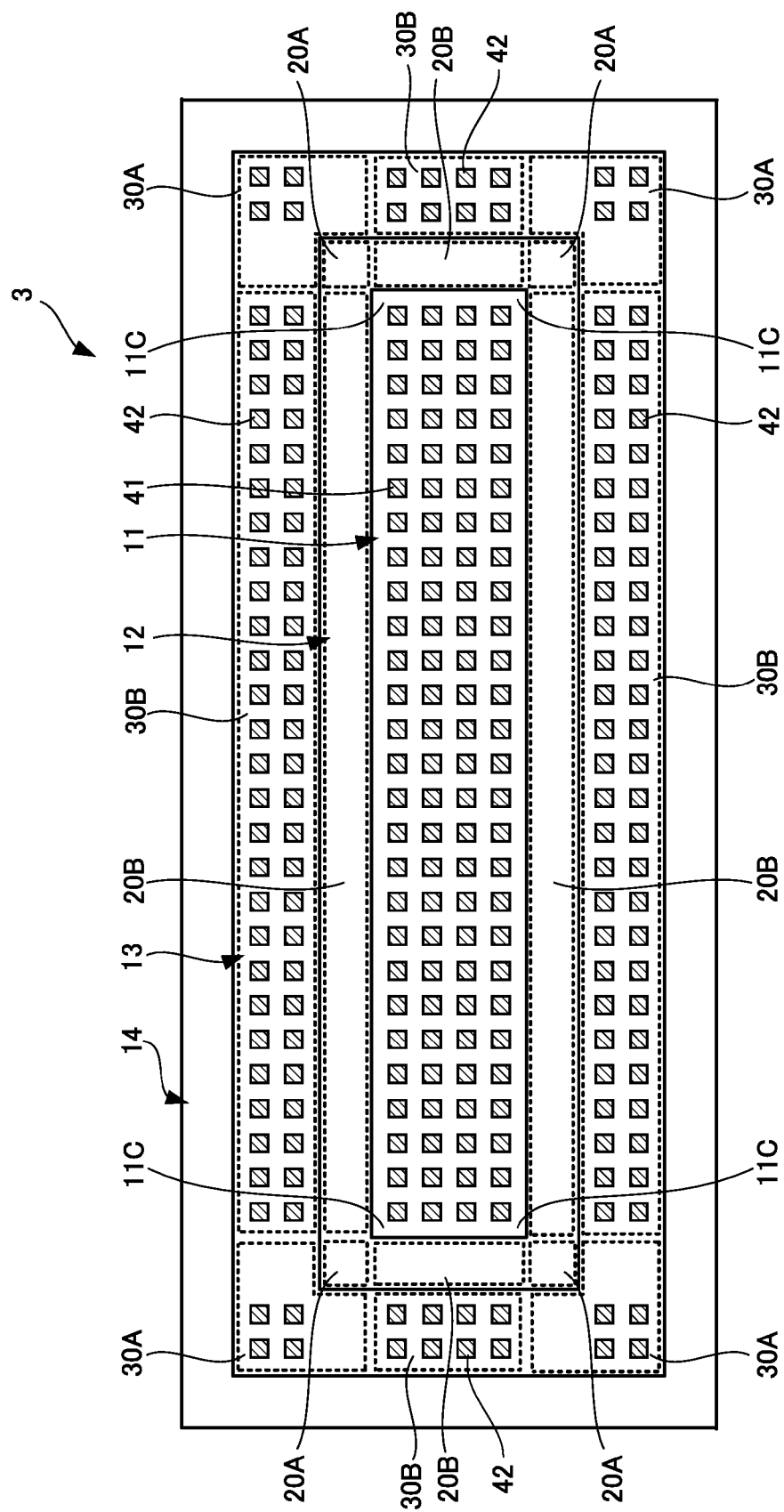
FIG. 15 is a plan view illustrating a configuration of a semiconductor device according to an exemplary embodiment of technology disclosed herein.

FIG. 15 is a plan view illustrating a configuration of a semiconductor device 3 according to a third exemplary embodiment of technology disclosed herein. In FIG. 15, configuration elements the same as or corresponding to those of the semiconductor devices 1 and 2 according to the first and second exemplary embodiments are allocated the same reference numerals, and detailed explanation thereof is omitted. The semiconductor device 3 according to the third exemplary embodiment differs from the semiconductor device 2 according to the second exemplary embodiment in that the density of the contacts 42 at the respective corner portions 30A of the anode region 13 is less than the density of the contacts 42 at the straight line portions 30B of the anode region 13. Note that the density of the contacts 42 at the corner portions 30A of the anode region 13 means the ratio of the surface area of the contacts 42 connected to the corner portions 30A, to the surface area of the corner portions 30A. The density of the contacts 42 at the straight line portions 30B of the anode region 13 means the ratio of the surface area of the contacts 42 connected to the straight line portions 30B, to the surface area of the straight line portions 30B.

The advantageous effect of suppressing a concentration of current at the respective corner portions of the cathode region 11 and the anode region 13 can surpass that of the semiconductor device 2 of the second exemplary embodiment due to setting the density of the contacts 42 less at the respective corner portions 30A of the anode region 13 than at the straight line portions 30B. Explanation follows regarding the relationship between the density of the contacts 42 at the corner portions 30A of the anode region 13 and the density of the contacts 42 at the straight line portions 30B for effectively suppressing a concentration of current during an electrostatic discharge.

As described above, it is envisaged that the current density at the respective corners 11C of the cathode region 11 and the respective corner portions 30A of the anode region 13 could reach up to approximately 1.5 times the current density at other locations. Accordingly, setting the density of the contacts 42 at the respective corner portions 30A of the anode region 13 to equal to or less than two-thirds (67%) of the density of the contacts 42 at the straight line portions 30B enables such a concentration of current to be eliminated.

In the semiconductor device 3, the contacts 42 are provided to the corner portions 30A of the anode region 13, albeit at a less density than at the straight line portions 30B, thereby retaining the advantageous effect of suppressing the occurrence of latch-up.

The semiconductor device 3 according to the third exemplary embodiment of technology disclosed herein enables higher discharge performance to be obtained than hitherto, as well as suppressing localized concentration of discharge current due to electrostatic discharge, similarly to the semiconductor device 1 according to the first exemplary embodiment. The semiconductor device 3 can moreover obtain advantageous effects that outperform the second exemplary embodiment in terms of ability to suppress a concentration of current during electrostatic discharge, and outperform the first exemplary embodiment in terms of ability to suppress the occurrence of latch-up.

Fourth Exemplary Embodiment

The semiconductor devices 1 to 3 of the first to the third exemplary embodiments are configured with the anode region 13 surrounding the outer periphery of the cathode region 11; however semiconductor devices of technology disclosed herein are not limited to such a configuration.

Figure 16:
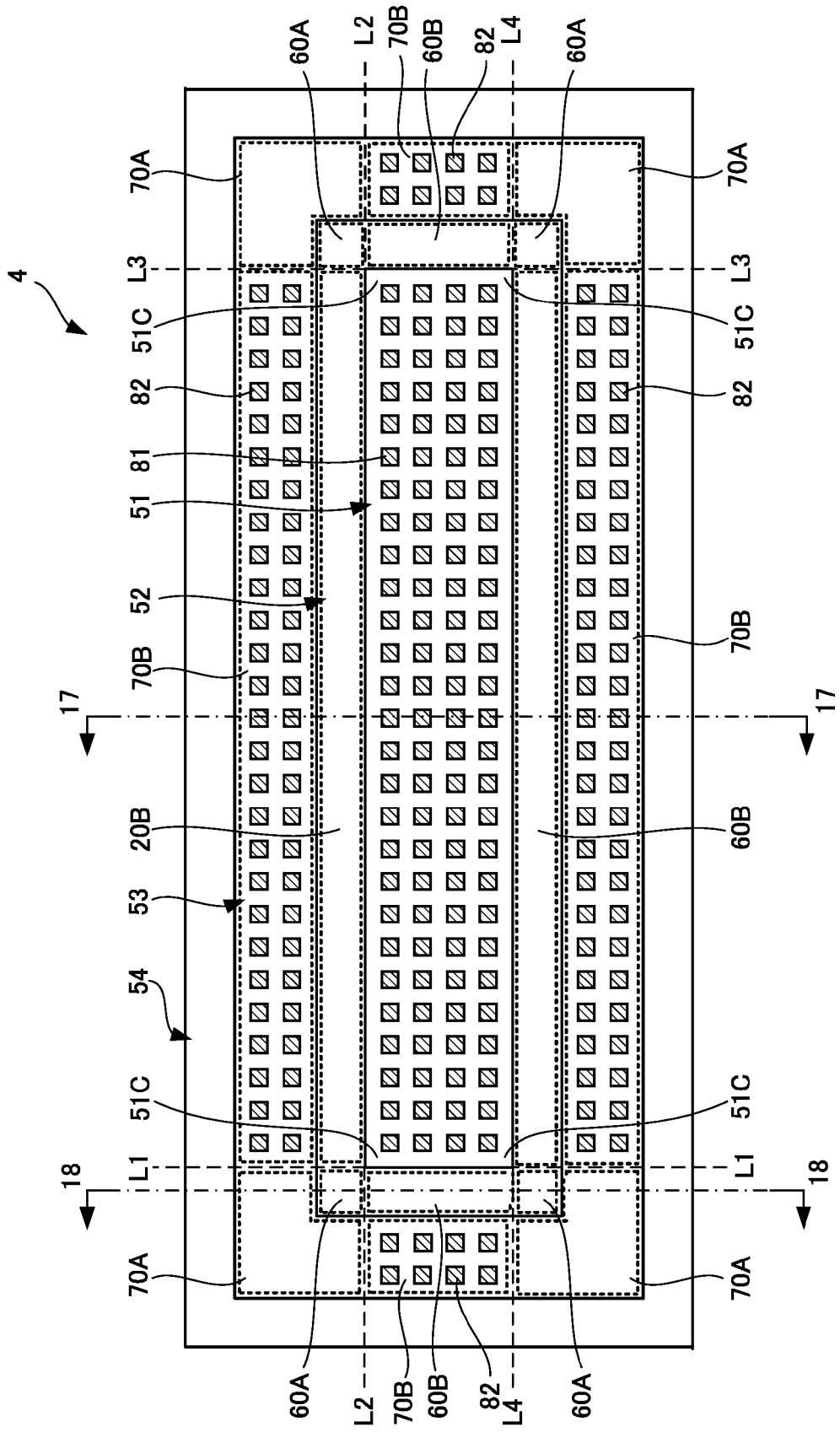
FIG. 16 is a plan view illustrating a configuration of a semiconductor device according to an exemplary embodiment of technology disclosed herein.
Figure 17:
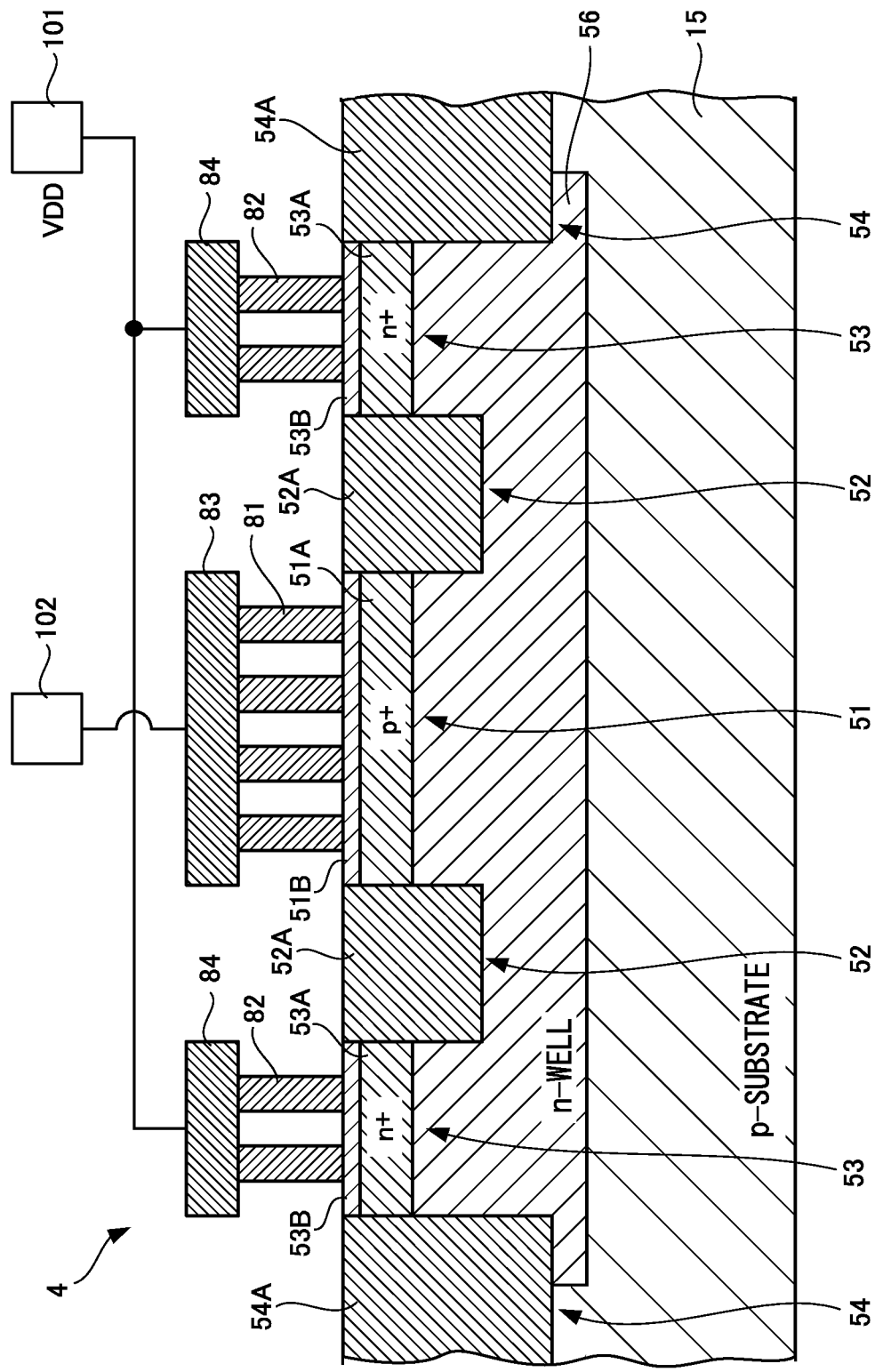
FIG. 17 is a cross-section taken along line 17-17 in FIG. 16.

FIG. 16 is a plan view illustrating a configuration of a semiconductor device 4 according to a fourth exemplary embodiment, and FIG. 17 is a cross-section taken along line 17-17 in FIG. 16. As an example, FIG. 17 illustrates circuit connections corresponding to the semiconductor device 1' situated at the top (on the power source (VDD) side) in FIG. 1.

The semiconductor device 4 according to the fourth exemplary embodiment has a configuration in which the placements of the anode region and the cathode region have been inverted from those of the semiconductor devices 1 to 3 of the first to the third exemplary embodiments. The semiconductor device 4 includes an anode region 51 with a rectangular shaped external profile with four corners (vertices) 51C, and a rectangular ring shaped first insulation region 52 surrounding the outer periphery of the anode region 51. The semiconductor device 4 further includes a rectangular ring shaped cathode region 53 surrounding the outer periphery of the first insulation region 52, and a rectangular ring shaped second insulation region 54 surrounding the outer periphery of the cathode region 53. The anode region 51 is an example of a first semiconductor region of technology disclosed herein. The cathode region 53 is an example of a second semiconductor region of technology disclosed herein. The first insulation region 52 is an example of a first insulation region of technology disclosed herein. The second insulation region 54 is an example of a second insulation region of technology disclosed herein.

As illustrated in FIG. 17, the semiconductor device 4 includes a p-type substrate 15, and an n-well 56 with n-type conductivity provided over the substrate 15. The anode region 51 includes a p-type semiconductor 51A formed in the surface portion of the n-well 56. The p-type semiconductor 51A may, for example, be formed by doping the surface of the n-well 56 with a group 3 element such as boron using an ion injection method. The anode region 51 includes a silicide layer 51B provided over the p-type semiconductor 51A. Plural contacts 81 that are electrically connected to the silicide layer 51B are provided on the surface of the anode region 51. The plural contacts 81 are electrically connected to an electrode pad 102 through a metal line 83 forming a signal line 122 (see FIG. 1).

The cathode region 53 includes an n-type semiconductor 53A formed in the surface portion of the n-well 56. The n-type semiconductor 53A may, for example, be formed by doping the surface of the n-well 56 with a group 5 element such as arsenic or phosphorous using an ion injection method. The cathode region 53 includes a silicide layer 53B provided over the n-type semiconductor 53A. Plural contacts 82 that are electrically connected to the silicide layer 53B are provided on the surface of the cathode region 53. The plural contacts 82 are connected to an electrode pad 101 through metal lines 84 forming a power source line 121 (see FIG. 1).

The first insulation region 52 extending between the anode region 51 and the cathode region 53 corresponds to the first insulation region 12 according to first to the third exemplary embodiments. The second insulation region 54 surrounding the outer periphery of the cathode region 53 corresponds to the second insulation region 14 according to the first to the third exemplary embodiments.

As illustrated in FIG. 16, the first insulation region 52 includes corner portions 60A corresponding to respective corners 51C of the anode region 51, and straight line portions 60B extending in straight lines along respective edges of the anode region 51. In the present exemplary embodiment, respective portions of the first insulation region 52 extending between extension lines of two respective adjacent edges of the anode region 51 (L1 and L2, L1 and L4, L3 and L2, and L3 and L4) configure the corner portions 60A of the first insulation region 52. Portions of the first insulation region 52 other than the corner portions 60A, namely portions between opposing edges of the anode region 51 and the cathode region 53, configure the straight line portions 60B of the first insulation region 52.

Similarly, the cathode region 53 includes corner portions 70A corresponding to the respective corners 51C of the anode region 51, and straight line portions 70B extending in straight lines along each edge of the anode region 51. In the present exemplary embodiment, respective portions of the cathode region 53 extending between extension lines of two respective adjacent edges of the anode region 51 (L1 and L2, L1 and L4, L3 and L2, and L3 and L4) configure the corner portions 70A of the cathode region 53. Portions of the cathode region 53 other than the corner portions 70A, namely the respective portions extending in straight line shapes following each edge of the anode region 51, configure the straight line portions 70B of the cathode region 53. In the semiconductor device 4, the contacts 82 are not connected to the respective corner portions 70A of the cathode region 53. Namely, the respective contacts 82 are connected to the straight line portions 70B of the cathode region 53.

Figure 18:
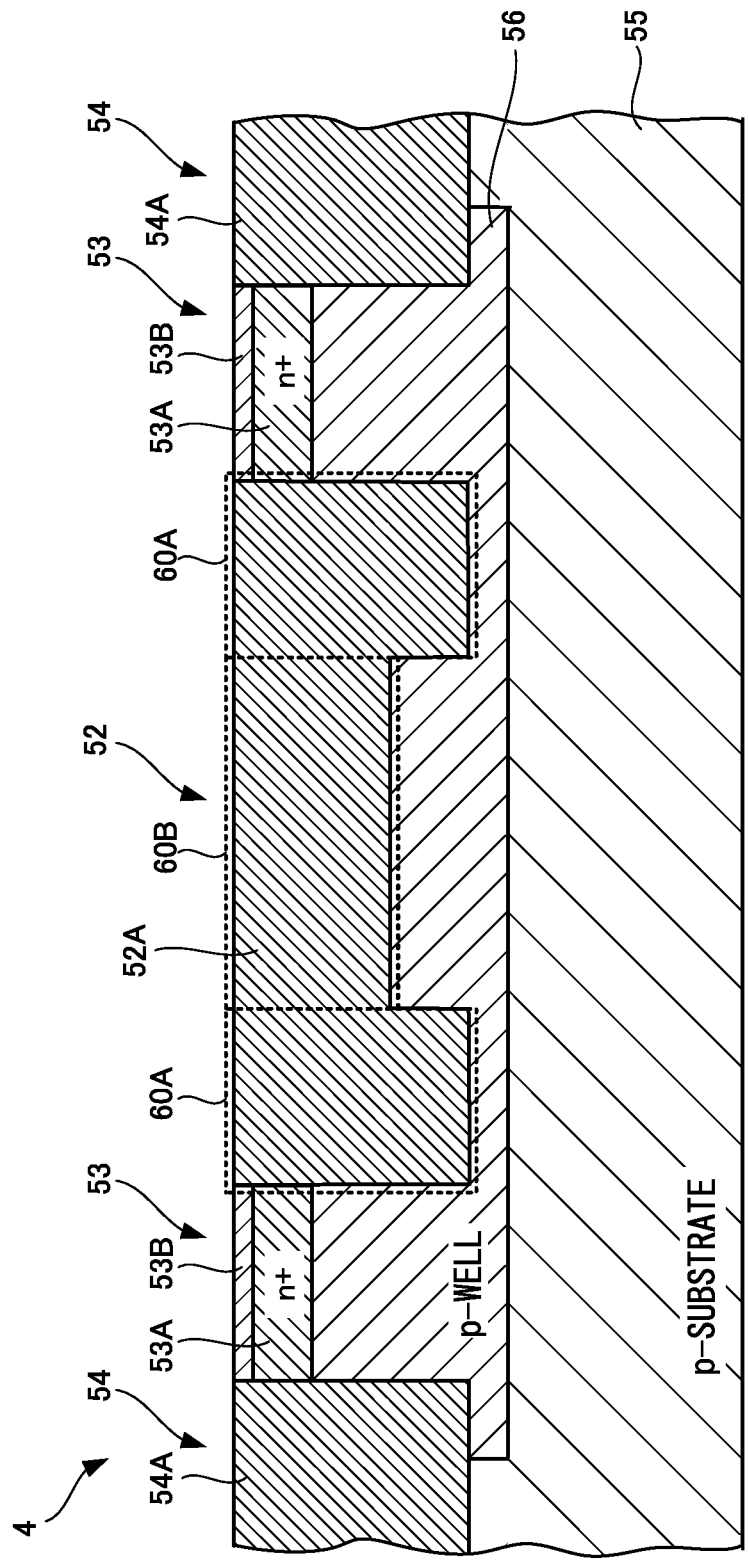
FIG. 18 is a cross-section taken along line 18-18 in FIG. 16.

FIG. 18 is a cross-section taken along line 18-18 in FIG. 16, passing through the corner portions 60A and one straight line portion 60B of the first insulation region 52. As illustrated in FIG. 18, the depth of an insulator 52A at the corner portions 60A of the first insulation region 52 is deeper than the depth of the insulator 52A at the straight line portion 60B. Moreover, the depth of the insulator 52A at the straight line portion 60B of the first insulation region 52 is shallower than the depth of an insulator 54A of the second insulation region 54. Namely, the straight line portion 60B of the first insulation region 52 has a partial trench structure. The bottom face of the insulator 52A of the straight line portion 60B of the first insulation region 52 may be disposed in the vicinity of, or above, a central position of the p-well 56 in the depth direction. The depth of the insulator 52A at the corner portions 60A of the first insulation region 52 may be the same as the depth of the insulator 54A of the second insulation region 54.

Similarly to the semiconductor device 1 according to the first exemplary embodiment, the semiconductor device 4 configured as described above is capable of obtaining the advantageous effects of obtaining higher discharge performance than hitherto, as well as suppressing localized concentration of discharge current due to electrostatic discharge. The semiconductor device 4 can also obtain advantageous effects similar to those of the semiconductor device 2 of the second exemplary embodiment by providing the respective contacts 82 at the corner portions 70A rather than only at the straight line portions 70B of the cathode region 53. Moreover, advantageous effects similar to those of the semiconductor device 3 according to the third exemplary embodiment can be obtained by setting the density of the contacts at the corner portions 70A of the cathode region 53 less than the density of the contacts at the straight line portions 70B.

Figure 19:
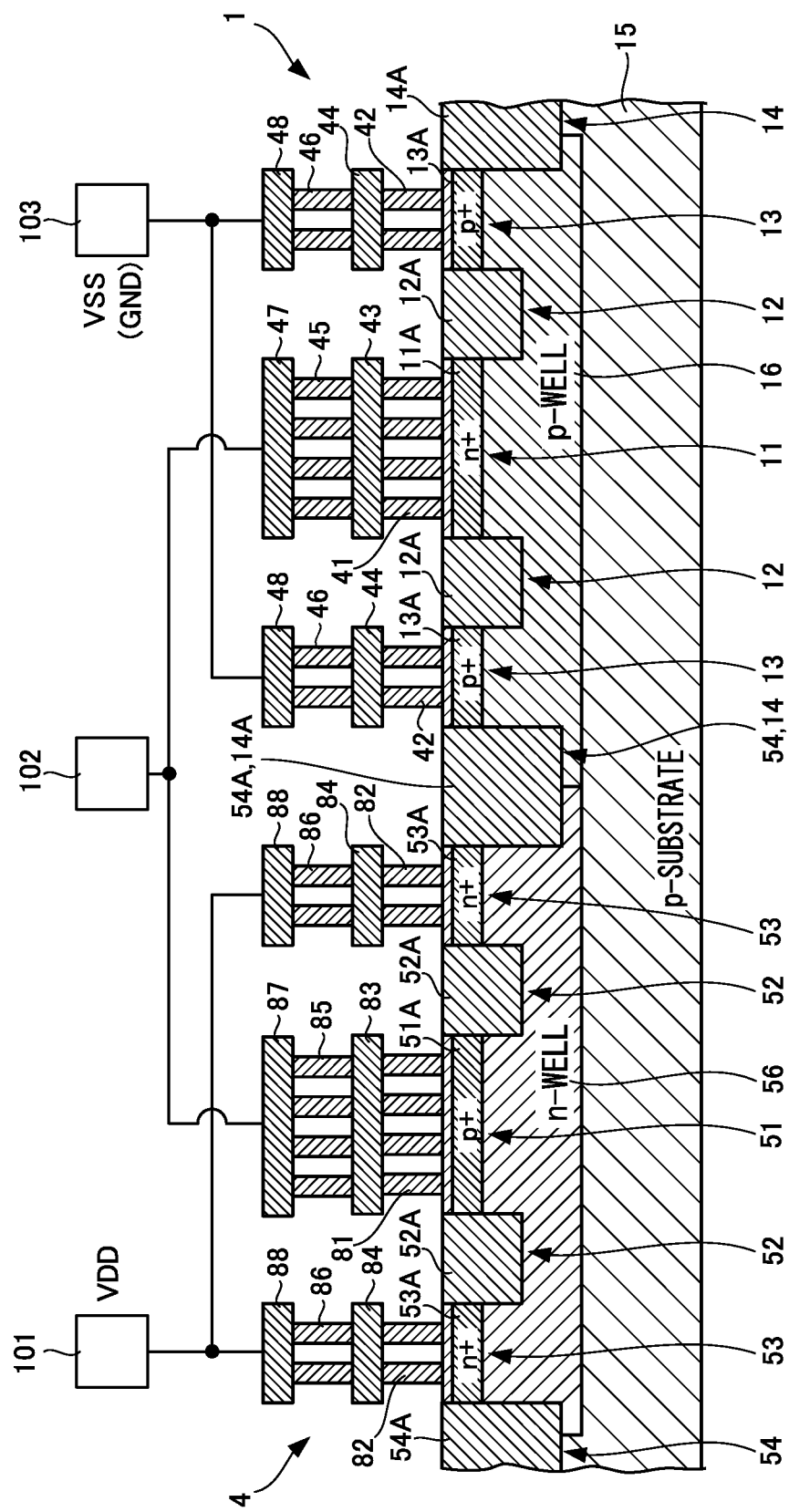
FIG. 19 is a cross-section illustrating a configuration of a semiconductor device according to an exemplary embodiment of technology disclosed herein.

As illustrated in FIG. 1, when a protection target circuit is protected using plural ESD protection semiconductor devices, the semiconductor devices 1 to 4 according to the first to the fourth exemplary embodiments may be employed in appropriate combinations. FIG. 19 illustrates an example in which the semiconductor device 1 according to the first exemplary embodiment and the semiconductor device 4 according to the fourth exemplary embodiment are employed in combination. As illustrated in FIG. 19, the semiconductor device 1 and the semiconductor device 4 may be provided adjacently to each other on the substrate 15. In the example illustrated in FIG. 19, the semiconductor device 4 is provided on the power source (VDD) side, and the semiconductor device 1 is provided on the ground (VSS) side.

Namely, the cathode region 53 of the semiconductor device 4 is connected to the electrode pad 101 through the contacts 82, first metal lines 84, vias 86, and second metal lines 88. The anode region 51 of the semiconductor device 4 is connected to the electrode pad 102 through the contacts 81, a first metal line 83, vias 85, and a second metal line 87.

The cathode region 11 of the semiconductor device 1 is connected to the electrode pad 102 through the contacts 41, a first metal line 43, vias 45, and a second metal line 47. The anode region 13 of the semiconductor device 1 is connected to the electrode pad 103 through the contacts 42, first metal lines 44, vias 46, and second metal lines 48. The semiconductor device 1 and the semiconductor device 4 are electrically isolated from one another by the second insulation region 14 (54).

Figure 20:
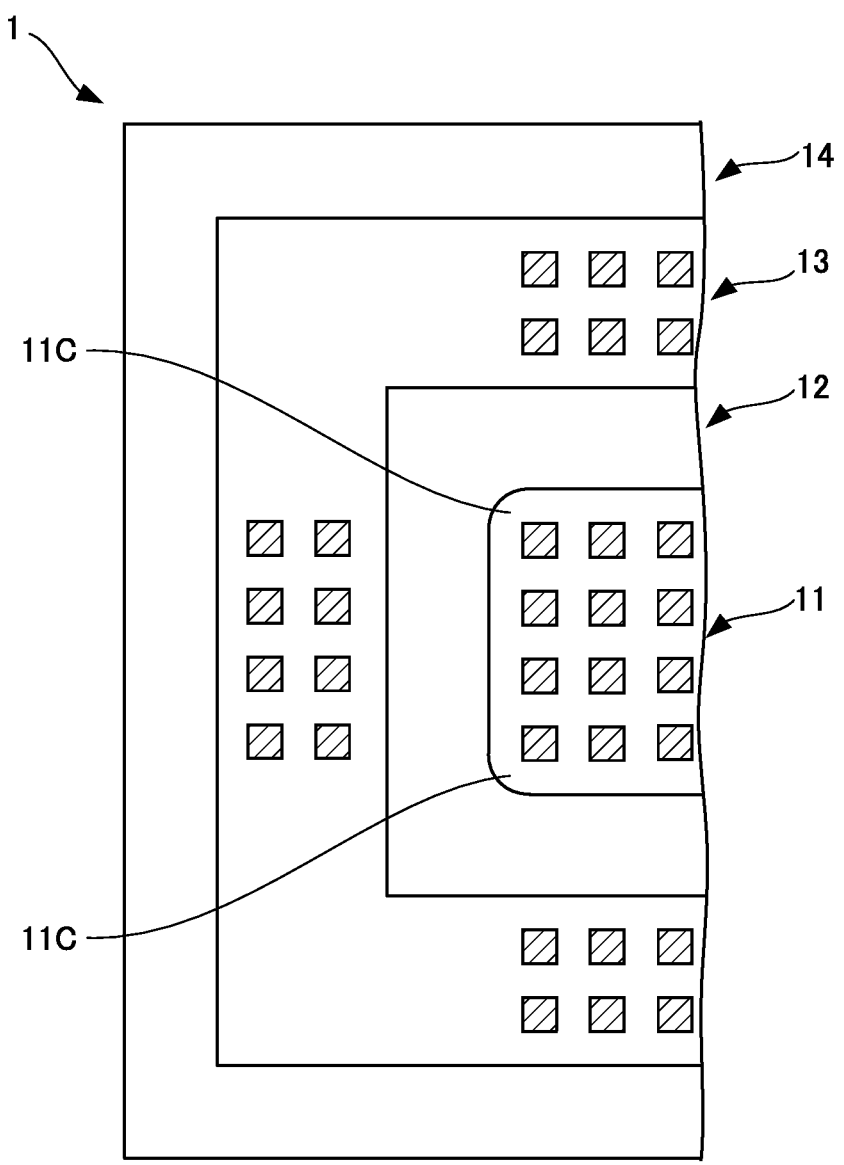
FIG. 20 is a plan view partially illustrating a configuration of a semiconductor device according to an exemplary embodiment of technology disclosed herein.

Various modifications may be made to the semiconductor devices 1 to 4 according to the first to the fourth exemplary embodiments. For example, in the semiconductor devices 1 to 3 according to the first to the third exemplary embodiments the corners 11C of the cathode region 11 may be rounded, as illustrated in FIG. 20. Similarly, in the semiconductor device 4 according to the fourth exemplary embodiment, the corners 51C of the anode region 51 may be rounded. In the above explanation, examples have been given in which the cathode region 11 of the semiconductor devices 1 to 3 according to the first to the third exemplary embodiments, and the anode region 51 of the semiconductor device 4 according to the fourth exemplary embodiment, have rectangular shaped external profiles; however there is no limitation thereto. It is sufficient that the cathode region 11 and the anode region 51 have a shape including at least one corner (vertex) that could encourage concentration of current during electrostatic discharge.

In one aspect of technology disclosed herein, a semiconductor device provided with an ESD protection function exhibits the advantageous effect of improving discharge performance compared to hitherto, as well as suppressing a localized concentration of discharge current due to electrostatic discharge.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
a first semiconductor region that has an external profile including at least one corner in a plan view, and that includes a semiconductor of a first conductivity type;
a first insulation region that surrounds an outer periphery of the first semiconductor region in a plan view, and that has a ring shape in a plan view;
a first insulator that is a part of the first insulation region, and that is located at a corner portion of the ring shape of the first insulation region in a plan view;
a second insulator that is a part of the first insulation region, that is located at a location other than the corner portion of the first insulation region in a plan view, and that has a depth shallower than a depth of the first insulator;
a second semiconductor region that surrounds an outer periphery of the first insulation region in a plan view, and that includes a semiconductor of a second conductivity type that is different from the first conductivity type;
a second insulation region that surrounds an outer periphery of the second semiconductor region; and
a third insulator that is a part of the second insulation region, and that has a depth deeper than the depth of the second insulator.

2. The semiconductor device of claim 1, wherein:
a minimum length of a current path located between the first semiconductor region and the second semiconductor region and passing under the corner portion of the ring shape of the first insulation region is 1.5 times a minimum length or greater of a current path located between the first semiconductor region and the second semiconductor region and passing under a location of the first insulation region other than the corner portion of the ring shape of the first insulation region.

3. The semiconductor device of claim 1, further comprising a plurality of contacts connected to the second semiconductor region, wherein:
the second semiconductor region has ring shape in a plan view; and
a contact density at a corner portion of the ring shape of the second semiconductor region is less than a contact density at a location of the second semiconductor region other than the corner portion of the ring shape of the second semiconductor region.

4. The semiconductor device of claim 3, wherein:
the contact density at the corner portion of the ring shape of the second semiconductor region is equal to or less than 67% of the contact density at the location of the second semiconductor region other than the corner portion of the ring shape of the second semiconductor region.

5. The semiconductor device of claim 1, further comprising a plurality of contacts connected to the second semiconductor region, wherein:
the second semiconductor region has a ring shape in a plan view; and
a contact density at a corner portion of the ring shape of the second semiconductor region is the same as a contact density at a location of the second semiconductor region other than the corner portion of the ring shape of the second semiconductor region.

6. The semiconductor device of claim 1, further comprising a plurality of contacts connected to the second semiconductor region, and wherein:
the second semiconductor region has a ring shape in a plan view;
no contact is connected to a corner portion of the ring shape of the second semiconductor region; and
the plurality of contacts are connected to a location of the second semiconductor region other than the corner portion of the ring shape of the second semiconductor region.

7. The semiconductor device of claim 1, wherein:
the first semiconductor region has a rectangular shaped external profile in a plan view; and
the corner portion of the ring shape of the first insulation region is a portion of the first insulation region extending between respective extension lines of two mutually adjacent edges of an outline of the first semiconductor region in a plan view.

8. The semiconductor device of claim 7, wherein:
the second semiconductor region has a ring shape in a plan view; and a corner portion of the ring shape of the second semiconductor region is a portion of the second semiconductor region extending between respective extension lines of two mutually adjacent edges of an outline of the first semiconductor region in a plan view.

9. The semiconductor device of claim 1, wherein:
the first semiconductor region includes an n-type semiconductor formed in a surface portion of a p-type well; and
the second semiconductor region includes a p-type semiconductor formed in the surface portion of the p-type well.

10. The semiconductor device of claim 1, wherein:
the first semiconductor region includes a p-type semiconductor formed in a surface portion of an n-type well; and
the second semiconductor region includes an n-type semiconductor formed in the surface portion of the n-type well.

11. An integrated circuit comprising:
a first semiconductor region that has an external profile including at least one corner in a plan view, and that includes a semiconductor of a first conductivity type;
a first insulation region that surrounds an outer periphery of the first semiconductor region in a plan view, and that has a ring shape in a plan view;
a first insulator that is a part of the first insulation region, and that is located at a corner portion of the ring shape of the first insulation region in a plan view;
a second insulator that is a part of the first insulation region, that is located at a location other than the corner portion of the first insulation region in a plan view, and that has a depth shallower than a depth of the first insulator;
a second semiconductor region that surrounds an outer periphery of the first insulation region in a plan view, and that includes a semiconductor of a second conductivity type that is different from the first conductivity type;
a second insulation region that surrounds an outer periphery of the second semiconductor region;
a third insulator that is a part of the second insulation region, and that has a depth deeper than the depth of the second insulator; and
a circuit connected to the first semiconductor region and the second semiconductor region through different lines.

12. The integrated circuit of claim 11, wherein:
a minimum length of a current path located between the first semiconductor region and the second semiconductor region and passing under the corner portion of the ring shape of the first insulation region is 1.5 times a minimum length or greater of a current path located between the first semiconductor region and the second semiconductor region and passing under a location of the first insulation region other than the corner portion of the ring shape of the first insulation region.

13. The integrated circuit of claim 11, further comprising a plurality of contacts connected to the second semiconductor region, wherein:
the second semiconductor region has ring shape in a plan view; and
a contact density at a corner portion of the ring shape of the second semiconductor region is less than a contact density at a location of the second semiconductor region other than the corner portion of the ring shape of the second semiconductor region.

14. The integrated circuit of claim 13, wherein:
the contact density at the corner portion of the ring shape of the second semiconductor region is equal to or less than 67% of the contact density at the location of the second semiconductor region other than the corner portion of the ring shape of the second semiconductor region.

15. The integrated circuit of claim 11, further comprising a plurality of contacts connected to the second semiconductor region, wherein:
the second semiconductor region has a ring shape in a plan view, and
a contact density at a corner portion of the ring shape of the second semiconductor region is the same as a contact density at a location of the second semiconductor region other than the corner portion of the ring shape of the second semiconductor region.

16. The integrated circuit of claim 11, further comprising a plurality of contacts connected to the second semiconductor region, and wherein:
the second semiconductor region has a ring shape in a plan view;
no contact is connected to a corner portion of the ring shape of the second semiconductor region; and
the plurality of contacts are connected to a location of the second semiconductor region other than the corner portion of the ring shape of the second semiconductor region.

17. The integrated circuit of claim 11, wherein:
the first semiconductor region has a rectangular shaped external profile in a plan view; and
the corner portion of the ring shape of the first insulation region is a portion of the first insulation region extending between respective extension lines of two mutually adjacent edges of an outline of the first semiconductor region in a plan view.

18. The integrated circuit of claim 17, wherein:
the second semiconductor region has ring shape in a plan view; and
a corner portion of the ring shape of the second semiconductor region is a portion of the second semiconductor region extending between respective extension lines of two mutually adjacent edges of an outline of the first semiconductor region in a plan view.

19. The integrated circuit of claim 11, wherein:
the first semiconductor region includes an n-type semiconductor formed in a surface portion of a p-type well; and
the second semiconductor region includes a p-type semiconductor formed in the surface portion of the well.

20. The integrated circuit of claim 11, wherein:
the first semiconductor region includes a p-type semiconductor formed in a surface portion of an n-type well; and
the second semiconductor region includes an n-type semiconductor formed in the surface portion of the well.

* * * * *